US012787384B2

(12) United States Patent
Cho et al.

(10) Patent No.: US 12,787,384 B2
(45) Date of Patent: Nov. 3, 2026

(54) INTEGRATED CIRCUIT DEVICE

(71) Applicant: Samsung Electronics Co., Ltd., Suwon-si (KR)

(72) Inventors: Kyunghee Cho, Suwon-si (KR); Donghoon Hwang, Suwon-si (KR); Hyojin Kim, Suwon-si (KR); Byungho Moon, Suwon-si (KR); Doyoung Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 259 days.

(21) Appl. No.: 18/643,104

(22) Filed: Apr. 23, 2024

(65) Prior Publication Data

US 2025/0107178 A1 Mar. 27, 2025

(30) Foreign Application Priority Data

Sep. 26, 2023 (KR) ........................ 10-2023-0129570

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 62/13*** | (2025.01) |
| ***H10D 84/83*** | (2025.01) |

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 62/151* (2025.01); *H10D 84/83* (2025.01)

(58) Field of Classification Search

None

See application file for complete search history.

(56) References Cited

U.S. PATENT DOCUMENTS

| | | | | |
|---|---|---|---|---|
| 11,239,236 | B2 | 2/2022 | Lilak et al. | |
| 11,289,484 | B2 | 3/2022 | Zhang et al. | |
| 11,329,168 | B2 | 5/2022 | Yang et al. | |
| 2022/0028899 | A1 | 1/2022 | Chen et al. | |
| 2022/0037535 | A1* | 2/2022 | Yang | H10B 10/125 |
| 2022/0328477 | A1* | 10/2022 | Chen | H10B 10/125 |
| 2023/0038116 | A1* | 2/2023 | Xie | H10D 30/014 |
| 2023/0197525 | A1 | 6/2023 | Briggs et al. | |
| 2023/0275085 | A1* | 8/2023 | Guler | H10D 30/6735 257/401 |

* cited by examiner

*Primary Examiner* — William B Partridge

*Assistant Examiner* — David Paul Sedorook

(74) *Attorney, Agent, or Firm* — Wolf, Greenfield & Sacks, P.C.

(57) ABSTRACT

An integrated circuit device includes a first fin and a second fin that extend in a first horizontal direction on a first region of a substrate, a third fin and a fourth fin that extend in the first horizontal direction on a second region of a substrate, a connected gate line at least partially surrounding a first channel region and a second channel region, and a separated gate line including a first separated portion that at least partially surrounds a third channel region and a second separated portion that at least partially surrounds a fourth channel region, where an uppermost portion of a top surface of the separated gate line is at a first vertical level, and an uppermost portion of a top surface of the connected gate line is at a second vertical level higher than the first vertical level.

20 Claims, 23 Drawing Sheets

INTEGRATED CIRCUIT DEVICE

CROSS-REFERENCE TO RELATED APPLICATION

This application is based on and claims priority under 35 U.S.C. § 119 to Korean Patent Application No. 10-2023-0129570, filed on Sep. 26, 2023, in the Korean Intellectual Property Office, the disclosure of which is incorporated by reference herein in its entirety.

TECHNICAL FIELD

The present disclosure relates to an integrated circuit device, and more particularly, to an integrated circuit device including forksheets.

BACKGROUND

As electronic products are desired to be miniaturized, multifunctional, and high performance, high capacity and high integration of integrated circuit devices are desired. Accordingly, there is a desire to efficiently design wiring structures to achieve high integration while securing the functions and operating speed desired for integrated circuit devices.

SUMMARY

The present disclosure provides an integrated circuit device with improved performance and reliability.

According to an aspect of the present disclosure, there is provided an integrated circuit device. The integrated circuit device may include a substrate including a first region and a second region, a first fin and a second fin that extend in a first horizontal direction, are on the first region, and are adjacent to each other in a second horizontal direction that intersects the first horizontal direction, a third fin and a fourth fin that extend in the first horizontal direction, are on the second region, and are adjacent to each other in the second horizontal direction, a first channel region on the first fin, a second channel region on the second fin, a third channel region on the third fin, a fourth channel region on the fourth fin, a connected gate line that at least partially surrounds the first channel region and the second channel region, extends in the second horizontal direction, and is on the first region, a separated gate line including a first separated portion that at least partially surrounds the third channel region and a second separated portion that at least partially surrounds the fourth channel region, where the third channel region and the fourth channel region extend in the second horizontal direction and are on the second region, a first vertical structure between the first channel region and the second channel region, a second vertical structure that is between the third channel region and the fourth channel region and insulates the first separated portion and the second separated portion of the separated gate line from each other, and a plurality of source/drain regions that contact each of the first channel region, the second channel region, the third channel region, and the fourth channel regions, where a top surface of the first vertical structure and a top surface of the second vertical structure are at a first vertical level, where an uppermost portion of a top surface of the connected gate line is at a second vertical level that is higher than the first vertical level, and where an uppermost portion of a top surface of the separated gate line is at the first vertical level.

According to another aspect of the present disclosure, there is provided an integrated circuit device. The integrated circuit device may include a substrate including a first region, a first fin and a second fin that extend in a first horizontal direction, are on the first region, and are adjacent to each other in a second horizontal direction that intersects the first horizontal direction, a first nanosheet stack that includes a plurality of first nanosheets and is on the first fin, a second nanosheet stack that includes a plurality of second nanosheets and is on the second fin, a connected gate line that at least partially surrounds the plurality of first nanosheets and the plurality of second nanosheets and extends in a second horizontal direction on the first region, a first vertical structure that contacts and is between the first nanosheet stack and the second nanosheet stack, and a plurality of source/drain regions spaced apart from each other, where the connected gate line is between the plurality of source/drain regions, where a top surface of the first vertical structure is at a first vertical level, where an uppermost portion of a top surface of the connected gate line is at a second vertical level that is higher than the first vertical level, where a lowermost portion of the top surface of the connected gate line is at the first vertical level, and where the uppermost portion of the top surface of the connected gate line overlaps the first vertical structure in a vertical direction.

According to another aspect of the present disclosure, there is provided an integrated circuit device. The integrated circuit device may include a substrate including a first region and a second region that are adjacent to each other in a second horizontal direction that intersects a first horizontal direction, a first fin and a second fin that extend in the first horizontal direction, are on the first region, and are adjacent to each other in the second horizontal direction, a third fin and a fourth fin that extend in the first horizontal direction, are on the second region, and are adjacent to each other in the second horizontal direction, a first nanosheet stack that includes a plurality of first nanosheets and is on the first fin, a second nanosheet stack that includes a plurality of second nanosheets and is on the second fin, a third nanosheet stack that includes a plurality of third nanosheets and is on the third fin, a fourth nanosheet stack that includes a plurality of fourth nanosheets and is on the fourth fin, a connected gate line that at least partially surrounds the plurality of first nanosheets and the plurality of second nanosheets, extends in the second horizontal direction, and is on the first region, a separated gate line that includes a first separated portion that at least partially surrounds the plurality of third nanosheets and a second separated portion that at least partially surrounds the plurality of fourth nanosheets, where the separated gate line overlaps the connected gate line in the second horizontal direction, and where the separated gate line extends in the second horizontal direction and is on the second region, a first vertical structure that contacts the plurality of first nanosheets and the plurality of second nanosheets and is between the first fin and the second fin, a second vertical structure that contacts the plurality of third nanosheets and the plurality of fourth nanosheets, is between the third fin and the fourth fin, and insulates the first separated portion and the second separated portion from each other, a cutting structure that is between the connected gate line and the separated gate line and insulates the connected gate line and the separated gate line from each other, a first gate contact electrically connected to the connected gate line, and a second gate contact electrically connected to the separated gate line, where a top surface of each of the first vertical structure and a top surface of the second vertical structure are at a first vertical level, where an uppermost portion of a top surface of the connected gate line is at a second vertical level that is higher than the first vertical level, where an uppermost portion of a top surface of the separated gate line is at the first vertical level, and where the uppermost portion of the top surface of the connected gate line overlaps the first vertical structure in a vertical direction.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
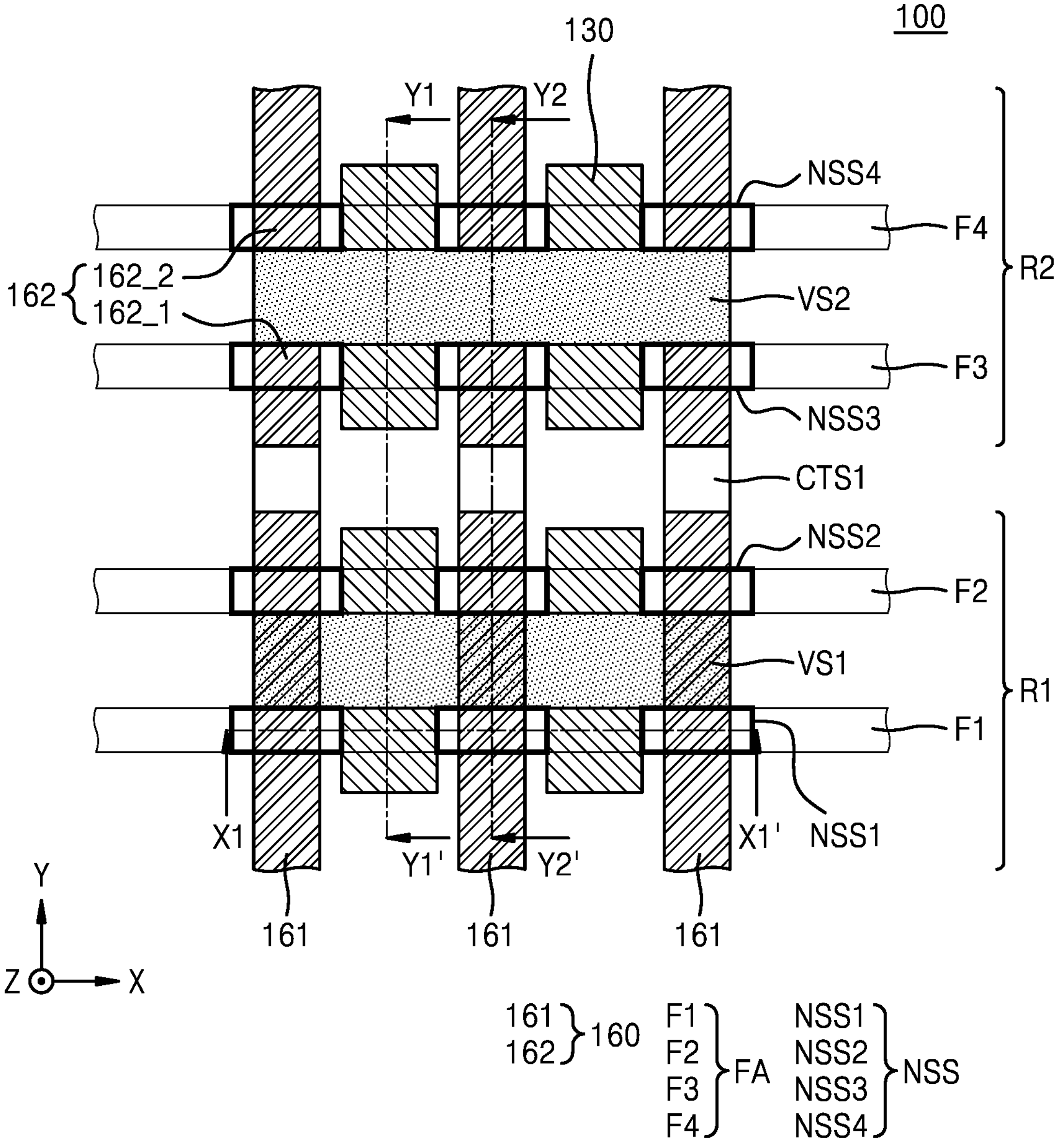
FIG. 1 is a plane layout diagram of an integrated circuit device according to some embodiments.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items. The term "connected" may be used herein to refer to a physical and/or electrical connection and may refer to a direct or indirect physical and/or electrical connection. Components or layers described with reference to "overlap" in a particular direction may be at least partially obstructed by one another when viewed along a line extending in the particular direction or in a plane perpendicular to the particular direction.

Hereinafter, embodiments are described in detail with reference to the accompanying drawings. The same reference numerals are used for the same components in the drawings, and duplicate descriptions thereof are omitted.

Figure 2A:
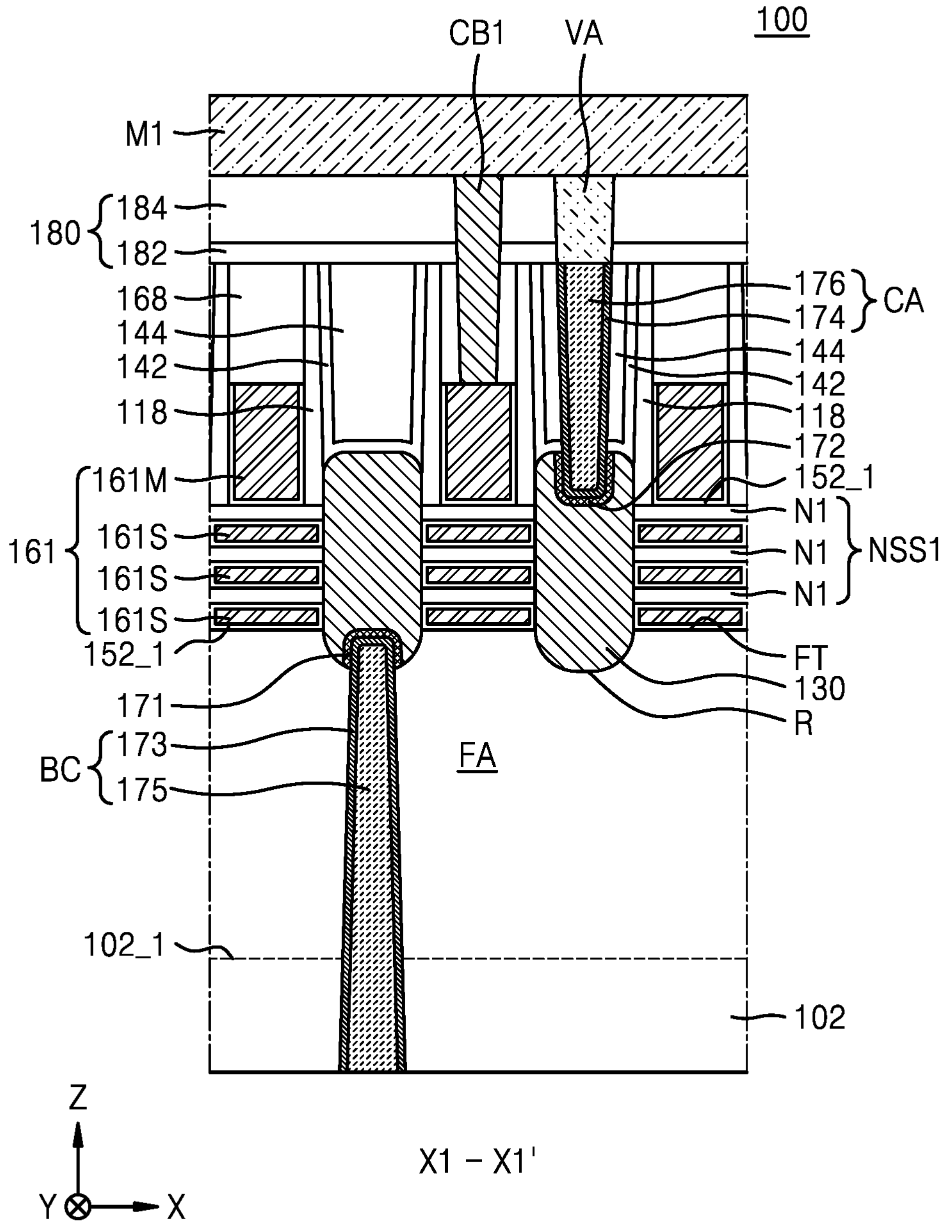
FIGS. 2A, 2B, and 2C are cross-sectional views of an integrated circuit device according to some embodiments.
Figure 2B:
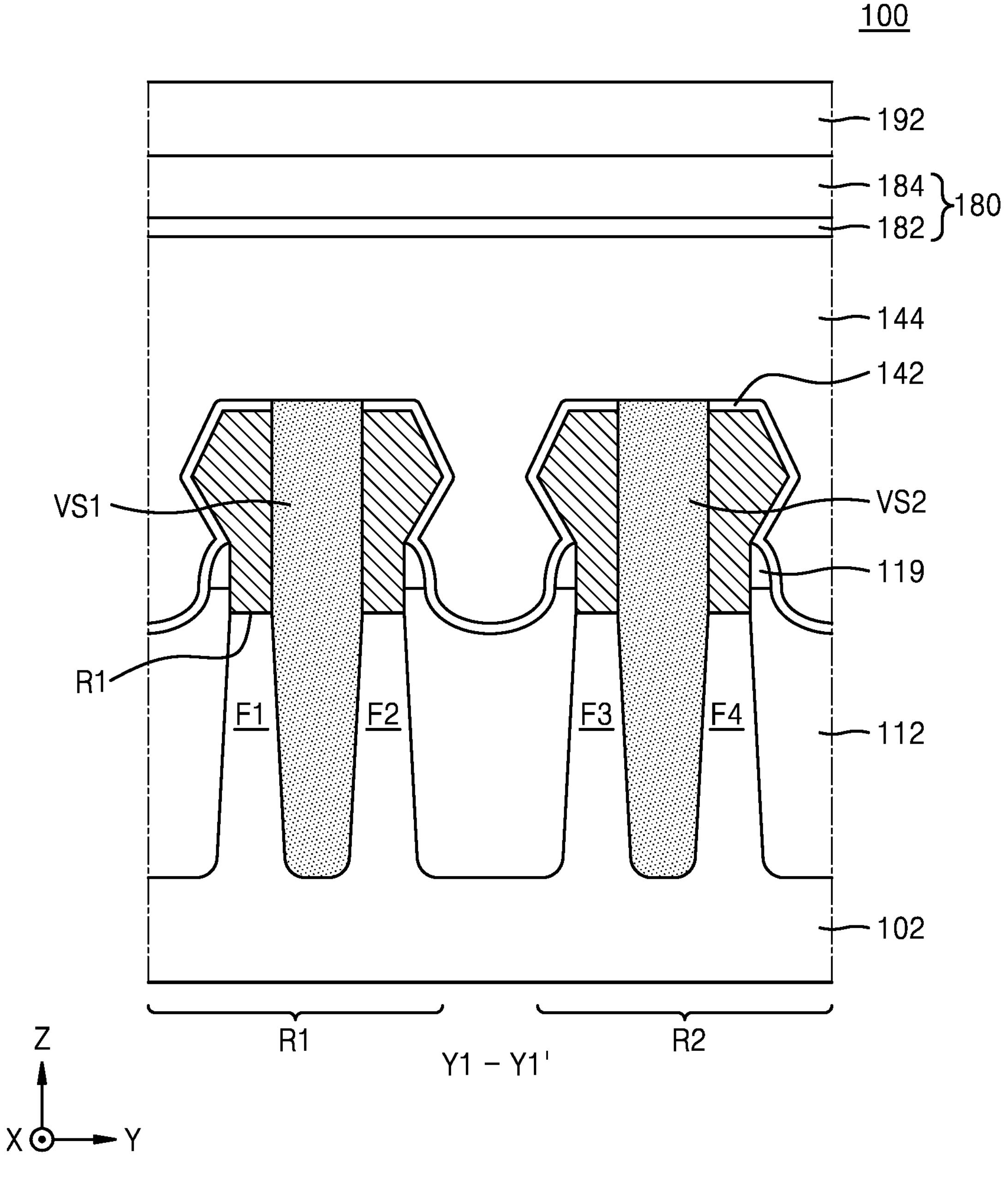
Figure 2C:
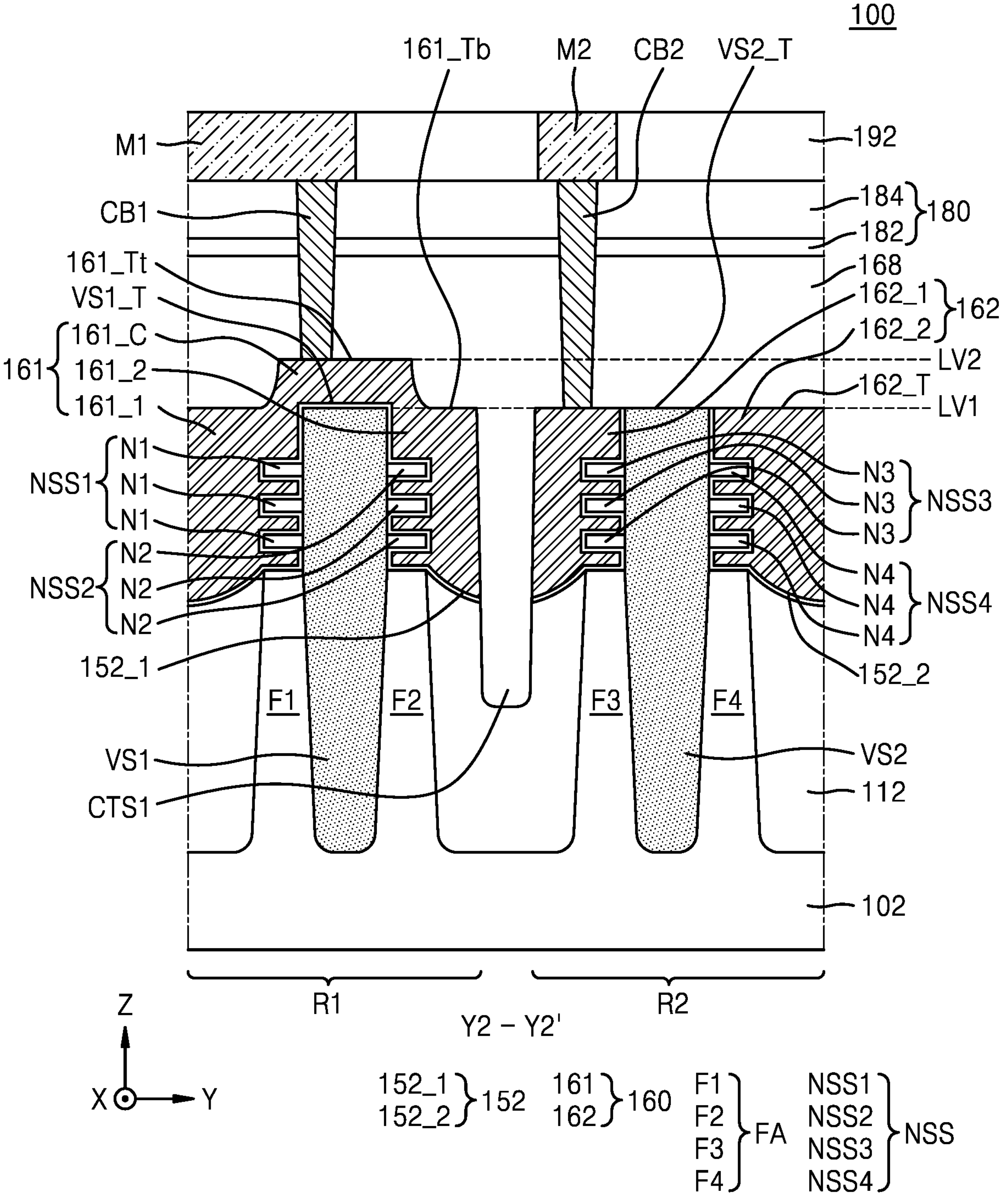

FIG. 1 is a plane layout diagram of an integrated circuit device 100 according to some embodiments. FIGS. 2A to 2C are cross-sectional views of an integrated circuit device 100 according to some embodiments. Specifically, FIG. 2A is a cross-sectional view taken along line X1-X1' of FIG. 1. FIG. 2B is a cross-sectional view taken along line Y1-Y1' of FIG. 1. FIG. 2C is a cross-sectional view taken along line Y2-Y2' of FIG. 1.

Referring to FIGS. 1 and 2A to 2C, an integrated circuit device 100 including a field effect transistor having a gate-all-around structure including an active region in the shape of a nanowire or nanosheet and a gate surrounding the active region is described.

The integrated circuit device 100 may include a substrate 102 having a first surface 102_1, and a plurality of fin-type active regions FA protruding or extending from the first surface 102_1 of the substrate 102. The plurality of fin-type active regions FA may be elongated in a first horizontal direction (X direction) and may extend parallel to each other on the substrate 102.

The substrate 102 may include a semiconductor, such as Si or Ge, or a compound semiconductor, such as SiGe, SiC, GaAs, InAs, InGaAs, or InP. The terms "SiGe", "SiC", "GaAs", "InAs", "InGaAs", and "InP" used herein refer to materials composed of elements included in each term, and are not chemical formulas that represent stoichiometric relationships. The substrate 102 may include a conductive region, for example, a well doped with impurities, or a structure doped with impurities. The substrate 102 may include a first region R1 and a second region R2 adjacent to each other in a second horizontal direction (Y direction).

The plurality of fin-type active regions FA may include a first fin F1, a second fin F2, a third fin F3, and a fourth fin F4, each extending in the first horizontal direction (X direction). In some embodiments, the first fin F1 may be adjacent to the second fin F2 in the second horizontal direction (Y direction). The third fin F3 may be adjacent to the fourth fin F4 in the second horizontal direction (Y direction).

In some embodiments, the first fin F1 and the second fin F2 may be arranged on the first region R1 of the substrate 102. The third fin F3 and the fourth fin F4 may be arranged on the second region R2 of the substrate 102. For example, the second fin F2 may be arranged adjacent to the second region R2. For example, the third fin F3 may be arranged adjacent to the first region R1. For example, the second fin F2 may be adjacent to the third fin F3 in the second horizontal direction (Y direction).

In some embodiments, the distance between the first fin F1 and the second fin F2 and the distance between the third fin F3 and the fourth fin F4 may be less than the distance between the second fin F2 and the third fin F3. For example, the first fin F1, the second fin F2, the third fin F3, and the fourth fin F4 may not be arranged at equal intervals in the second horizontal direction (Y direction). In some embodiments, the first fin F1, the second fin F2, the third fin F3, and the fourth fin F4 may be arranged at equal intervals in the second horizontal direction (Y direction).

A device isolation film 112 may be positioned in a trench defining the plurality of fin-type active regions FA. The device isolation film 112 may cover or overlap a portion of the sidewall of each of the plurality of fin-type active regions FA and may be spaced apart from the substrate 102 in a vertical direction (Z direction). The device isolation film 112 may include a silicon oxide film. The device isolation film 112 may include a material that has an etch selectivity different from that of the substrate 102.

As illustrated in FIGS. 1, 2A, and 2C, a plurality of gate lines 160 may be arranged on the plurality of fin-type active regions FA. Each of the plurality of gate lines 160 may extend in the second horizontal direction (Y direction) that intersects the first horizontal direction (X direction). In regions where the plurality of fin-type active regions FA intersect the plurality of gate lines 160, a plurality of nanosheet stacks NSS may be arranged on top of a fin top surface FT of each of the plurality of fin-type active regions FA. The plurality of nanosheet stacks NSS may each include at least one nanosheet facing the fin top surface FT at a position spaced apart from the fin top surface FT of the fin-type active region FA in the vertical direction (Z direction). The term "nanosheet" used herein refers to a conductive structure having a cross-section substantially perpendicular to a direction in which current flows. The nanosheet should be understood to include nanowires.

As illustrated in FIGS. 2A and 2C, the plurality of nanosheet stacks NSS may include a plurality of nanosheets overlapping each other in the vertical direction (Z direction) on the fin-type active region FA. The plurality of nanosheets may have different vertical distances (Z-direction distances) from the fin top surface FT of the fin-type active region FA. Each of the plurality of gate lines 160 may at least partially surround a plurality of nanosheets included in the nanosheet stack NSS overlapping each other in the vertical direction (Z direction).

Specifically, a first nanosheet stack NSS1 may include a plurality of first nanosheets N1 overlapping each other in the vertical direction (Z direction) on the first fin F1. A plurality of first nanosheets N1 may have different vertical distances (z-direction distances) from a fin top surface of the first fin F1.

Likewise, a second nanosheet stack NSS2 may include a plurality of second nanosheets N2 overlapping each other in the vertical direction (Z direction) on the second fin F2. A third nanosheet stack NSS3 may include a plurality of third nanosheets N3 overlapping each other in the vertical direction (Z direction) on the third fin F3. A fourth nanosheet stack NSS4 may include a plurality of fourth nanosheets N4 overlapping each other in the vertical direction (Z direction) on the fourth fin F4.

Each of the plurality of nanosheets included in the plurality of nanosheet stacks NSS may function as a channel region. Each of the plurality of first nanosheets N1 included in the first nanosheet stack NSS1 placed on the first fin F1 may be referred to as a first channel region. Each of the plurality of second nanosheets N2 included in the second nanosheet stack NSS2 placed on the second fin F2 may be referred to as a second channel region. Each of the plurality of third nanosheets N3 included in the third nanosheet stack NSS3 placed on the third fin F3 may be referred to as a third channel region. Each of the plurality of fourth nanosheets N4 included in the fourth nanosheet stack NSS4 placed on the fourth fin F4 may be referred to as a fourth channel region.

In FIG. 1, a case in which a planar shape of the nanosheet stack NSS is approximately rectangular is illustrated, but the present disclosure is not limited thereto. The nanosheet stack NSS may have various planar shapes according to the planar shape of each of the fin-type active regions FA and the gate lines 160. A configuration in which the plurality of nanosheet stacks NSS and the plurality of gate lines 160 are arranged on one fin-type active region FA, and the plurality of nanosheet stacks NSS are arranged in a row along the first horizontal direction (X direction) on one fin-type active region FA is illustrated herein. However, the number of nanosheet stacks NSS and gate lines 160 placed on one fin-type active region FA is not particularly limited.

In some embodiments, each of the plurality of nanosheets may have a thickness within a range of about 4 nm to about 6 nm, but is not limited thereto. The thickness of each of the plurality of nanosheets refers to a size in the vertical direction (Z direction). In some embodiments, the plurality of nanosheets may have substantially the same thickness in the vertical direction (Z direction). In some embodiments, at least some of the plurality of nanosheets may have different thicknesses in the vertical direction (Z direction). In some embodiments, the plurality of nanosheets each contained in the plurality of nanosheet stacks NSS may include a Si layer, a SiGe layer, or a combination thereof.

As illustrated in FIG. 2A, a plurality of nanosheets included in one nanosheet stack (e.g., first nanosheet stack NSS1) may have the same or similar sizes in the first horizontal direction (X direction). In one variation, at least some of the plurality of nanosheets included in one nanosheet stack (e.g., first nanosheet stack NSS1) may have different sizes in the first horizontal direction (X direction). A case where the plurality of nanosheet stacks NSS each consist of three nanosheets is illustrated herein, but the present disclosure is not limited thereto. For example, the nanosheet stack NSS may include at least one nanosheet, and the number of nanosheets constituting the nanosheet stack NSS is not particularly limited.

As illustrated in FIGS. 1, 2B, and 2C, a first vertical structure VS1 may be placed between the first fin F1 and the second fin F2 on the first region R1 of the substrate 102. The first vertical structure VS1 may be placed between the first nanosheet stack NSS1 and the second nanosheet stack NSS2. The first vertical structure VS1 may extend in the vertical direction (Z direction) on the substrate 102. The first vertical structure VS1 may be in contact with the plurality of first nanosheets N1 included in the first nanosheet stack NSS1. The first vertical structure VS1 may be in contact with a side surface of each of the plurality of first nanosheets N1 included in the first nanosheet stack NSS1. The first vertical structure VS1 may be in contact with the plurality of second nanosheets N2 included in the second nanosheet stack NSS2. The first vertical structure VS1 may be in contact with a side surface of each of the plurality of second nanosheets N2 included in the second nanosheet stack NSS2. For example, the first vertical structure VS1 may be in contact with the first channel region and the second channel region.

A second vertical structure VS2 may be placed between the third fin F3 and the fourth fin F4 on the second region R2 of the substrate 102. The second vertical structure VS2 may be placed between the third nanosheet stack NSS3 and the fourth nanosheet stack NSS4. The second vertical structure VS2 may extend in the vertical direction (Z direction) on the substrate 102. The second vertical structure VS2 may be in contact with the plurality of third nanosheets N3 included in the third nanosheet stack NSS3. The second vertical structure VS2 may be in contact with a side surface of each of the plurality of third nanosheets N3 included in the third nanosheet stack NSS3. The second vertical structure VS2 may be in contact with the plurality of fourth nanosheets N4 included in the fourth nanosheet stack NSS4. The second vertical structure VS2 may be in contact with a side surface of each of the plurality of fourth nanosheets N4 included in the fourth nanosheet stack NSS4. For example, the second vertical structure VS2 may be in contact with the third channel region and the fourth channel region.

For example, the first vertical structure VS1 and the second vertical structure VS2 may include a dielectric material.

As illustrated in FIG. 2C, a top surface VS1_T of the first vertical structure VS1 and a top surface VS2_T of the second vertical structure VS2 may be located at the same vertical level (e.g., a distance between the top surface VS1_T and the first surface 102_1 of the substrate 102 is the same as a distance between the top surface VS2_T and the first surface 102_1). Specifically, both the top surface VS1_T of the first vertical structure VS1 and the top surface VS2_T of the second vertical structure VS2 may be located at a first vertical level LV1.

As illustrated in FIG. 2A, a plurality of connected gate lines 161 may each include a main gate portion 161M and a plurality of sub-gate portions 161S. The main gate portion 161M may cover or overlap a top surface of the first nanosheet stack NSS1 and may extend in the second horizontal direction (Y direction). The plurality of sub-gate portions 161S and the main gate portion 161M may be integrally formed (e.g., each connected gate line 161 is provided by a single, unitary object), and one of the plurality of sub-gate portions 161S may be placed between each of the plurality of first nanosheets N1 and between the lowermost first nanosheet N1 among the plurality of first nanosheets N1 and the first fin F1. In the vertical direction (Z direction), the thickness of each of the plurality of sub-gate portions 161S may be less than the thickness of the main gate portion 161M.

Referring to FIG. 2C, the main gate portion 161M may extend in the second horizontal direction (Y direction) while covering or overlapping a top surface of the second nanosheet stack NSS2, and one of the plurality of sub-gate portions 161S may be placed between each of the plurality of second nanosheets N2 and between the lowermost second nanosheet N2 among the plurality of second nanosheets N2 and the second fin F2.

Likewise, referring to FIG. 2C, each of separated gate lines 162 may include a main gate portion and a plurality of sub-gate portions.

As illustrated in FIGS. 1 and 2C, the connected gate line 161 and the separated gate line 162 that overlap in the second horizontal direction (Y direction) may be placed on the substrate 102.

The connected gate line 161 may be placed on the first region R1 of the substrate 102. The connected gate line 161 may at least partially surround the plurality of first nanosheets N1 and the plurality of second nanosheets N2. For example, the connected gate line 161 may at least partially surround the first channel region and the second channel region.

Specifically, the connected gate line 161 may include a first connected portion 161_1, a second connected portion 161_2, and a common portion 161_C. The first connected portion 161_1 may at least partially surround the plurality of first nanosheets N1 on the first fin F1. For example, the first connected portion 161_1 may surround the first channel region. The second connected portion 161_2 may at least partially surround the plurality of second nanosheets N2 on the second fin F2. For example, the second connected portion 161_2 may surround the second channel region. The first connected portion 161_1 and the second connected portion 161_2 may each be placed on side surfaces of the first vertical structure VS1. The common portion 161_C may connect the first connected portion 161_1 to the second connected portion 161_2. The common portion 161_C located at a vertical level higher than the first connected portion 161_1 and the second connected portion 161_2 may be placed on the top surface of each of the first connected portion 161_1 and the second connected portion 161_2. The common portion 161_C may be placed on the top surface VS1_T of the first vertical structure VS1.

The first connected portion 161_1 may overlap with the first nanosheet stack NSS1 in the vertical direction (Z direction). The second connected portion 161_2 may overlap with the second nanosheet stack NSS2 in the vertical direction (Z direction). The common portion 161_C may overlap with the first vertical structure VS1 in the vertical direction (Z direction). The first vertical structure VS1 may be placed between the first connected portion 161_1 and the second connected portion 161_2. The first vertical structure VS1 may overlap with the first connected portion 161_1 and the second connected portion 161_2 in the second horizontal direction (Y direction).

The common portion 161_C may include a portion that overlaps with each of the first connected portion 161_1 and the second connected portion 161_2 in the vertical direction (Z direction). The first connected portion 161_1, the second connected portion 161_2, and the common portion 161_C of the connected gate line 161 may be integrally formed.

Accordingly, as the connected gate line 161 of the integrated circuit device 100 according to some embodiments includes the first connected portion 161_1, the second connected portion 161_2, and the common portion 161_C that are integrally formed, and as such, the resistance of the connected gate line 161 may be reduced. Specifically, an interface may not be formed between the first connected portion 161_1, the second connected portion 161_2, and the common portion 161_C, thereby reducing the resistance of the connected gate line 161. That is, the integrated circuit device 100 with improved performance and reliability may be provided by some embodiments.

The separated gate line 162 may be placed on the second region R2 of the substrate 102. The separated gate line 162 may at least partially surround the plurality of third nanosheets N3 and the plurality of fourth nanosheets N4. For example, the separated gate line 162 may surround the third channel region and the fourth channel region.

Specifically, the separated gate line 162 may include a first separated portion 162_1, and a second separated portion 162_2. The first separated portion 162_1 may at least partially surround the plurality of third nanosheets N3 on the third fin F3. For example, the first separated portion 162_1 may surround the third channel region. The second separated portion 162_2 may at least partially surround the plurality of fourth nanosheets N4 on the fourth fin F4. For example, the second separated portion 162_2 may surround the fourth channel region. The first separated portion 162_1 may overlap with the third nanosheet stack NSS3 in the vertical direction (Z direction). The second separated portion 162_2 may overlap with the fourth nanosheet stack NSS4 in the vertical direction (Z direction). The first separated portion 162_1 and the second separated portion 162_2 may overlap with the second vertical structure VS2 in the second horizontal direction (Y direction).

In some embodiments, the first separated portion 162_1 and the second separated portion 162_2 may be spaced apart from each other in the second horizontal direction (Y direction) with the second vertical structure VS2 positioned therebetween. Specifically, the second vertical structure VS2 may insulate the first separated portion 162_1 and the second separated portion 162_2. The first separated portion 162_1 and the second separated portion 162_2 may each be placed on side surfaces of the first vertical structure VS2. The separated gate line 162 may not be placed on the top surface VS2_T of the second vertical structure VS2.

In some embodiments, a top surface of the connected gate line 161 may be located at or above the first vertical level LV1 and at or below the second vertical level LV2 on the first region R1.

An uppermost portion 161_Tt of the top surface of the connected gate line 161 may be located at a vertical level higher than the top surface VS1_T of the first vertical structure VS1. An uppermost portion of a top surface may refer to a portion located at the highest vertical level of the top surface. Specifically, the uppermost portion 161_Tt of the top surface of the connected gate line 161 may be located at the second vertical level LV2 higher than the first vertical level LV1.

In some embodiments, the common portion 161_C of the connected gate line 161 may be located at a vertical level higher than the first connected portion 161_1 and the second connected portion 161_2. For example, the uppermost portion 161_Tt of the top surface of the connected gate line 161 may include an uppermost portion of a top surface of the common portion 161_C. For example, the uppermost portion of the top surface of the common portion 161_C of the connected gate line 161 may be located at the second vertical level LV2. For example, the top surface of the common portion 161_C of the connected gate line 161 may include a portion located at the second vertical level LV2.

In some embodiments, the top surface of the first connected portion 161_1 and/or the second connected portion 161_2 of the connected gate line 161 may include a portion located at the first vertical level LV1.

A lowermost portion 161_Tb of the top surface of the connected gate line 161 may be located at the same vertical level as the top surface VS1_T of the first vertical structure VS1. A lowermost portion of a top surface may refer to a portion located at the lowest vertical level of the top surface. Specifically, the lowermost portion 161_Tb of the top surface of the connected gate line 161 may be located at the first vertical level LV1.

In some embodiments, a top surface 162_T of the separated gate line 162 may be located at the same vertical level as the top surface VS2_T of the second vertical structure VS2 on the second region R2. Specifically, the top surface 162_T of the separated gate line 162 may be located at the first vertical level LV1. For example, an uppermost portion of the top surface 162_T of the separated gate line 162 may be located at the first vertical level LV1.

In other words, the uppermost portion 161_Tt of the top surface of the connected gate line 161 on the first region R1 may be located at a vertical level higher than the top surface VS1_T of the first vertical structure VS1, the top surface VS2_T of the second vertical structure VS2, and the top surface 162_T of the separated gate line 162. The lowermost portion 161_Tb of the top surface of the connected gate line 161 may be located at the same vertical level as the top surface VS1_T of the first vertical structure VS1, the top surface VS2_T of the second vertical structure VS2, and the top surface 162_T of the separated gate line 162.

In some embodiments, the uppermost portion 161_Tt of the top surface of the connected gate line 161 on the first region R1 may overlap with the first vertical structure VS1 in the vertical direction (Z direction).

In some embodiments, a portion of the top surface of the connected gate line 161 that overlaps with the first connected portion 161_1 and the second connected portion 161_2 may be located at a vertical level lower than the uppermost portion 161_Tt of the top surface of the connected gate line 161. For example, a portion of the top surface of the connected gate line 161 that overlaps with the first connected portion 161_1 and the second connected portion 161_2 may be located above the first vertical level LV1 and below the second vertical level LV2.

Accordingly, a cross-section of the connected gate line 161 of the integrated circuit device 100, which is perpendicular to the first horizontal direction (X direction), may have a smaller area than when the top surface of the connected gate line 161 is located straight at the second vertical level LV2. That is, the integrated circuit device 100 in which the capacitance of the connected gate line 161 is reduced may be provided by some embodiments. That is, the integrated circuit device 100 with improved performance and reliability may be provided by some embodiments.

Each of the plurality of gate lines 160 may include metal, metal nitride, metal carbide, or a combination thereof. The metal may be selected from titanium (Ti), tungsten (W), ruthenium (Ru), Niobium (Nb), molybdenum (Mo), Hafnium (Hf), Nickel (Ni), cobalt (Co), Platinum (Pt), Ytterbium (Yb), Terbium (Tb), Dysprosium (Dy), Erbium (Er), and Palladium (Pd). The metal nitride may be selected from titanium nitride (TiN) and tantalum nitride (TaN). The metal carbide may be titanium aluminum carbide (TiAlC). However, the material constituting the plurality of gate lines 160 is not limited thereto.

As illustrated in FIGS. 1 and 2C, a first cutting structure CTS1 may be placed between the connected gate line 161 and the separated gate line 162. The first cutting structure CTS1 may overlap with the connected gate line 161 and the separated gate line 162 in the second horizontal direction (Y direction). The first cutting structure CTS1 may be in contact with the connected gate line 161 and the separated gate line 162. The first cutting structure CTS1 may insulate the connected gate line 161 and the separated gate line 162 from each other. A bottom surface of the first cutting structure CTS1 may be located at a vertical level lower than a lowermost portion of a bottom surface of each of the connected gate line 161 and the separated gate line 162. The first cutting structure CTS1 may include a silicon nitride film.

As illustrated in FIGS. 2A and 2B, a plurality of recesses R may be formed on the fin-type active region FA. The vertical level of the lowest surface of each of the plurality of recesses R may be lower than the vertical level of the fin top surface FT of the fin-type active region FA.

As illustrated in FIGS. 2A and 2B, a plurality of source/drain regions 130 may be placed within the plurality of recesses R. The plurality of source/drain regions 130 may each be placed adjacent to at least one gate line 160 selected from among the plurality of gate lines 160. Each of the plurality of source/drain regions 130 may have surfaces facing a plurality of nanosheets included in an adjacent nanosheet stack NSS. Each of the plurality of source/drain regions 130 may be in contact with the plurality of nanosheets included in the adjacent nanosheet stack NSS.

As illustrated in FIGS. 2A and 2C, a gate dielectric film 152 may be placed between the nanosheet stack NSS and the gate line 160. The gate dielectric film 152 may include a first gate dielectric film 152_1 on the first region R1 and a second gate dielectric film 152_2 on the second region R2.

The first gate dielectric film 152_1 on the first region R1 may be placed between each of the first nanosheet stack NSS1 and the second nanosheet stack NSS2, and the connected gate line 161. Specifically, the first gate dielectric film 152_1 may be placed between the plurality of first nanosheets N1 and the connected gate line 161, between the plurality of second nanosheets N2 and the connected gate line 161, and between the connected gate line 161 and the first vertical structure VS1. The first gate dielectric film 152_1 may extend on the side surfaces and the top surface of the first vertical structure VS1. As described above, as the connected gate line 161 is placed on the top surface of the first vertical structure VS1, the first gate dielectric film 152_1 may be placed on the top surface VS1_T of the first vertical structure VS1.

The second gate dielectric film 152_2 may be placed between each of the third nanosheet stack NSS3 and the fourth nanosheet stack NSS4, and the separated gate line 162 on the second region R2. Specifically, the second gate dielectric film 152_2 may be placed between the plurality of third nanosheets N3 and the connected gate line 162, between the plurality of fourth nanosheets N4 and the connected gate line 162, and between the separated gate line 162 and the second vertical structure VS2. The second gate dielectric film 152_2 may extend on the side surfaces of the second vertical structure VS2. The second gate dielectric film 152_2 may not be placed on the top surface VS2_T of the second vertical structure VS2.

In some embodiments, the gate dielectric film 152 may include a structure in which an interface dielectric film and a high dielectric film are stacked. The interface dielectric film may include a low dielectric material film with a dielectric constant of about 9 or less, for example, a silicon oxide film, a silicon oxynitride film, or a combination thereof. In some embodiments, the interface dielectric film may be omitted. The high dielectric film may include a material with a higher dielectric constant than the silicon oxide film. For example, the high dielectric film may have a dielectric constant of about 10 to about 25. The high dielectric film may include hafnium oxide, but is not limited thereto.

As illustrated in FIGS. 2A and 2C, the top surface of each of the gate dielectric film 152 and the gate line 160 may be covered or overlapped with a capping insulating pattern 168. The capping insulating pattern 168 may include a silicon nitride film. The capping insulating pattern 168 may be integrated with the above-described first cutting structure CTS1.

Both sidewalls of each of the gate line 160 and the capping insulating pattern 168 may be covered or overlapped with an outer insulating spacer 118. The outer insulating spacer 118 may cover or overlap both sidewalls of the main gate portion 160M on the top surface of the plurality of nanosheet stacks NSS. The outer insulating spacer 118 may be spaced apart from the gate line 160 with the gate dielectric film 152 positioned therebetween.

As illustrated in FIG. 2B, a plurality of recess-side insulating spacers 119 covering or overlapping the sidewalls of the source/drain region 130 may be arranged on the top surface of the device isolation film 112. In some embodiments, each of the plurality of recess-side insulating spacers 119 may be connected to the outer insulating spacer 118 adjacent thereto.

The plurality of outer insulating spacers 118 and the plurality of recess-side insulating spacers 119 may each include silicon nitride, silicon oxide, SiCN, SiBN, SiON, SiOCN, SiBCN, SiOC, or a combination thereof. The terms "SiCN", "SiBN", "SiON", "SiOCN", "SiBCN", and "SiOC" used herein refer to materials composed of elements included in each term, and are not chemical formulas that represent stoichiometric relationships.

A first metal silicide film 172 may be formed on the top surface of each of the plurality of source/drain regions 130. The first metal silicide film 172 may include a metal made of Ti, W, Ru, Nb, Mo, Hf, Ni, Co, Pt, Yb, Tb, Dy, Er, or Pd. For example, the first metal silicide film 172 may include titanium silicide, but is not limited thereto.

The plurality of source/drain regions 130, the plurality of first metal silicide films 172, and the plurality of outer insulating spacers 118 may be covered or overlapped with an insulating liner 142 on the substrate 102. In some embodiments, insulating liner 142 may be omitted. An inter-gate insulating film 144 may be disposed on the insulating liner 142. When the insulating liner 142 is omitted, the inter-gate insulating film 144 may be in contact with the plurality of source/drain regions 130.

The insulating liner 142 and the inter-gate insulating film 144 may be sequentially arranged on the plurality of source/drain regions 130 and the plurality of first metal silicide films 172. The insulating liner 142 and the inter-gate insulating film 144 may form an insulating structure. In some embodiments, the insulating liner 142 may include silicon nitride, SiCN, SiBN, SiON, SiOCN, SiBCN, or a combination thereof, but is not limited thereto. The inter-gate insulating film 144 may include a silicon oxide film, but is not limited thereto.

Both sidewalls of each of the plurality of sub-gate portions 161S included in the connected gate line 161 may be spaced apart from the source/drain region 130 with the first gate dielectric film 152_1 positioned therebetween. The first gate dielectric film 152_1 may be positioned between the sub-gate portion 161S included in the connected gate line 161 and each of the plurality of first nanosheets N1, and between the sub-gate portion 161S included in the connected gate line 161 and the adjacent source/drain region 130.

The plurality of nanosheet stacks NSS may be placed on the fin top surface FT of each of the plurality of fin-type active regions FA in regions where the plurality of fin-type active regions FA intersect the plurality of gate lines 160, and may face the fin top surface FT of the fin-type active region FA at a position spaced apart from the fin-type active region FA. A plurality of nanosheet transistors may be formed in portions where the plurality of fin-type active regions FA intersect the plurality of gate lines 160 on the substrate 102.

As illustrated in FIG. 2A, an active contact CA may be disposed on the source/drain region 130. The active contact CA may pass or extend through the inter-gate insulating film 144 and the insulating liner 142 in the vertical direction (Z direction) to be in contact with the first metal silicide film 172. The active contact CA may be configured to be electrically connected to the source/drain region 130 through the first metal silicide film 172.

The active contact CA may include a conductive barrier pattern 174 and a contact plug 176 sequentially stacked on the source/drain region 130. The conductive barrier pattern 174 may at least partially surround and contact a bottom surface and sidewalls of the contact plug 176. The active contact CA may be elongated in the vertical direction (Z direction) through the inter-gate insulating film 144 and the insulating liner 142. The conductive barrier pattern 174 may be positioned between the first metal silicide film 172 and the contact plug 176. The conductive barrier pattern 174 may have a surface in contact with the first metal silicide film 172 and a surface in contact with the contact plug 176. In some embodiments, the conductive barrier pattern 174 may include metal or metal nitride. For example, the conductive barrier pattern 174 may include Ti, Ta, W, TiN, TaN, WN, WCN, TiSiN, TaSIN, WSiN, or a combination thereof, but is not limited thereto. The contact plug 176 may consist of Mo, copper (Cu), W, Co, Ru, manganese (Mn), Ti, tantalum (Ta), and aluminum (Al), a combination thereof, or an alloy thereof, but is not limited thereto.

As illustrated in FIGS. 2A and 2B, the top surface of each of the active contact CA, the capping insulating pattern 168, and the inter-gate insulating film 144 may be covered or overlapped with an upper insulating structure 180. The upper insulating structure 180 may include an etch stop film 182 and an interlayer insulating film 184 sequentially stacked on each of the active contact CA, the plurality of capping insulating patterns 168, and the inter-gate insulating film 144. The etch stop film 182 may include silicon carbide (SiC), silicon nitride (SiN), nitrogen-doped silicon carbide (SiC:N), SiOC, AlN, AlON, AlO, AlOC, or a combination thereof. The interlayer insulating film 184 may include an oxide film, a nitride film, an ultra-low-k (ULK) film having an ultra-low dielectric constant K of about 2.2 to about 2.4, or a combination thereof. For example, the interlayer insulating film 184 may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto.

As illustrated in FIGS. 2A and 2B, a via contact VA may be disposed on the active contact CA. The via contact VA may pass or extend through the upper insulating structure 180 to be in contact with the active contact CA. Each of the source/drain regions 130 may be configured to be electrically connected to the via contact VA through the first metal silicide film 172 and the active contact CA. A bottom surface of the via contact VA may be in contact with a top surface of the active contact CA. The via contact VA may consist of W, Mo, and/or Ru, but is not limited thereto.

As illustrated in FIGS. 2A and 2B, a first wiring line M1 may pass or extend through an upper insulating film 192. The first wiring line M1 may be connected to the via contact VA positioned below the first wiring line M1. In some embodiments, the first wiring line M1 may extend in the first horizontal direction (X direction). The first wiring line M1 may include Mo, Cu, W, Co, Ru, Mn, Ti, and Ta, Al, a combination thereof, or an alloy thereof, but is not limited thereto.

As illustrated in FIGS. 2A and 2B, a backside contact BC may pass or extend through the substrate 102 to be in contact with the source/drain region 130. The backside contact BC may pass through the substrate 102 and the fin-type active region FA in the vertical direction (Z direction) to be in contact with the second metal silicide film 171. The backside contact BC may be configured to be electrically connected to the source/drain region 130 through the second metal silicide film 171.

The backside contact BC may include a barrier pattern 173 and a conductive plug 175 that are sequentially stacked. The barrier pattern 173 may at least partially surround and contact sidewalls and a top surface of the conductive plug 175. The barrier pattern 173 may be positioned between the second metal silicide film 171 and the conductive plug 175. The barrier pattern 173 may have a surface in contact with the second metal silicide film 171 and a surface in contact with the conductive plug 175.

In some embodiments, the barrier pattern 173 may include metal or metal nitride. For example, the barrier pattern 173 may include Ti, Ta, W, TiN, TaN, WN, WCN, TiSiN, TaSiN, WSiN, or a combination thereof, but is not limited thereto. The conductive plug 175 may consist of Mo, Cu, W, Co, Ru, Mn, Ti, Ta, and Al, a combination thereof, or an alloy thereof, but is not limited thereto.

As illustrated in FIGS. 2A and 2C, a first gate contact CB1 electrically connected to the connected gate line 161 may be placed on the first region R1. The first gate contact CB1 may pass or extend through the upper insulating structure 180 and the capping insulating pattern 168 in the vertical direction (Z direction) to be in contact with the connected gate line 161. The first gate contact CB1 may connect the connected gate line 161 to the first wiring line M1. In some embodiments, the first gate contact CB1 may be disposed on the top surface of the connected gate line 161. Specifically, the first gate contact CB1 may be disposed on the uppermost portion 161_Tt of the top surface of the connected gate line 161.

A second gate contact CB2 electrically connected to the separated gate line 162 may be placed on the second region R2. The second gate contact CB2 may pass or extend through the upper insulating structure 180 and the capping insulating pattern 168 in the vertical direction (Z direction) to be in contact with the separated gate line 162. The second gate contact CB2 may connect the separated gate line 162 to the second wiring line M2. In some embodiments, the second gate contact CB2 may be disposed on the top surface 162_T of the separated gate line 162.

Figure 3:
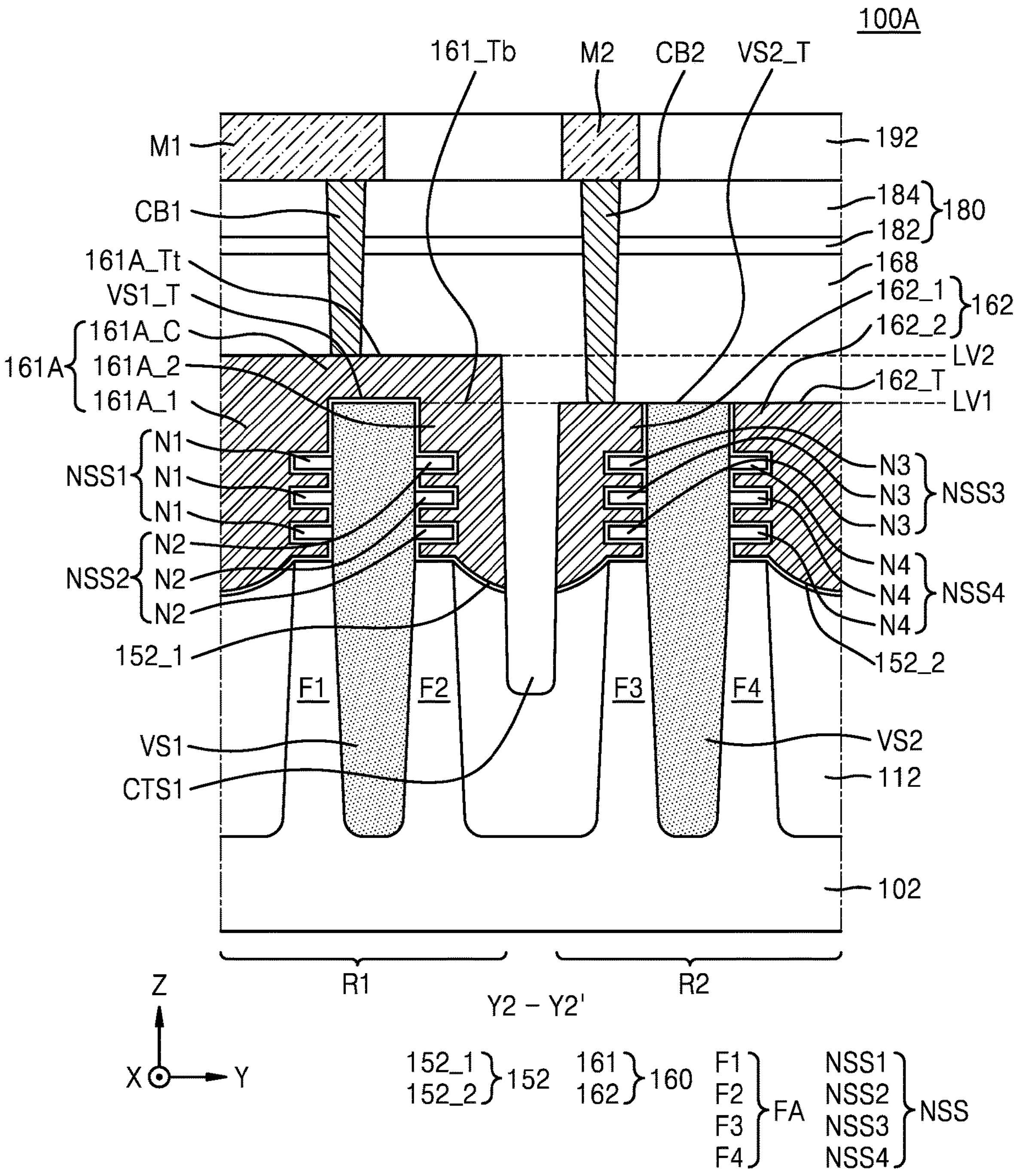
FIGS. 3 and 4 are cross-sectional views of an integrated circuit device according to some embodiments.
Figure 4:
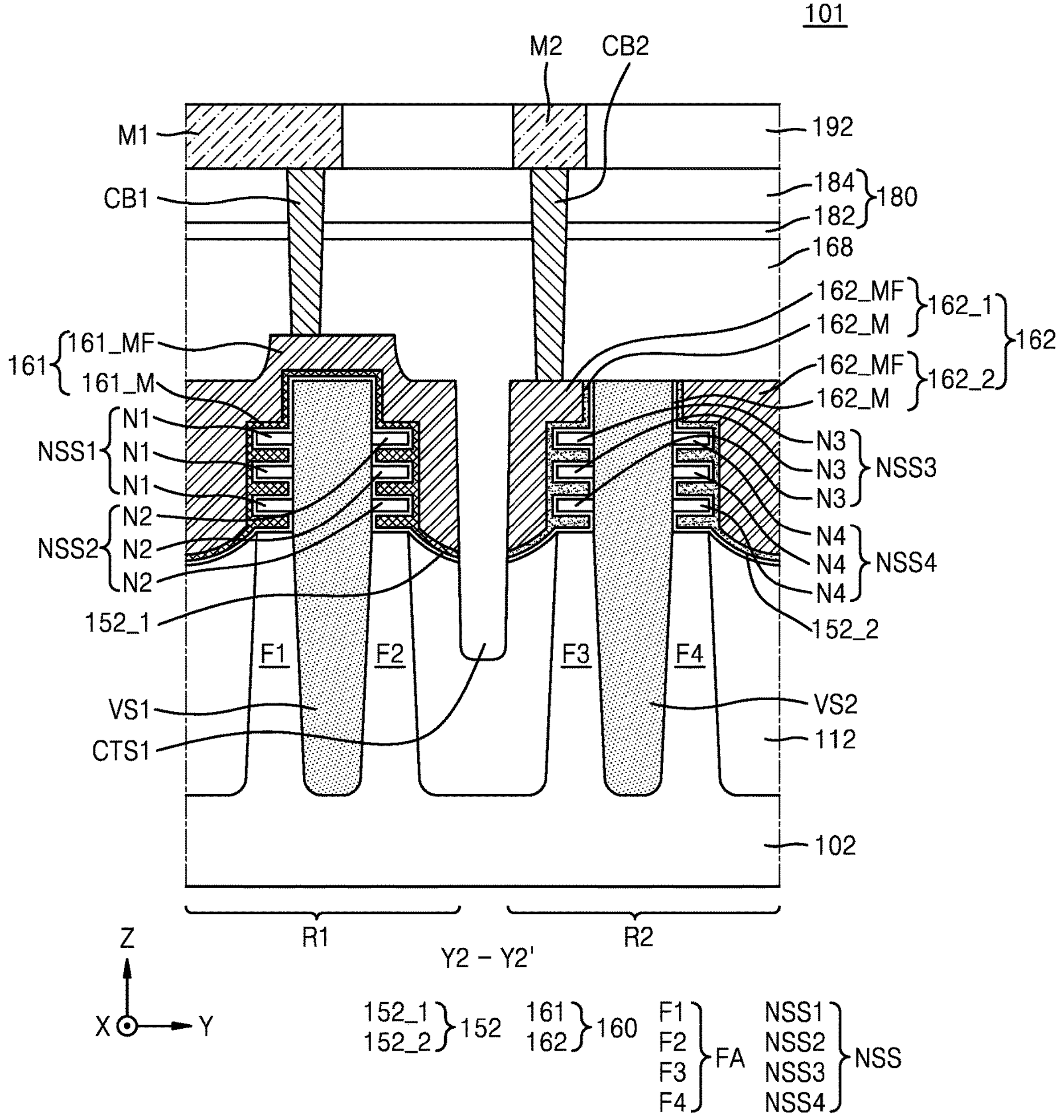

FIGS. 3 and 4 are cross-sectional views of an integrated circuit device 100A and 101, respectively, according to some embodiments. Hereinafter, the differences from the integrated circuit device 100 described with reference to FIGS. 1 and 2A to 2C are mainly described.

Referring to FIG. 3, an integrated circuit device 100A may be provided. The integrated circuit device 100A may include a connected gate line 161A that at least partially surrounds the plurality of first nanosheets N1 and the plurality of second nanosheets N2 on the first region R1.

Specifically, the connected gate line 161A may include a first connected portion 161A_1, a second connected portion 161A_2, and a common portion 161A_C. The first connected portion 161A_1 and the second connected portion 161A_2 may overlap with the common portion 161A_C in the vertical direction (Z direction). The first connected portion 161A_1, the second connected portion 161A_2, and the common portion 161A_C may be integrally formed and may be similar to the first connected portion 161_1, the second connected portion 161_2, and the common portion 161_C described with reference to FIGS. 1 and 2C.

In some embodiments, a top surface 161A_Tt of the connected gate line 161A may be located at a vertical level higher than the top surface VS1_T of the first vertical structure VS1 on the first region R1. The top surface 161A_Tt of the connected gate line 161A may be located at a vertical level higher than the first vertical level LV1. The top surface 161A_Tt of the connected gate line 161A may be located at the second vertical level LV2.

In some embodiments, the top surface of the common portion 161A_C of the connected gate line 161A may be located at a vertical level higher than the first vertical level LV1. The top surface of the common portion 161A_C of the connected gate line 161A may be located at the second vertical level LV2.

In other words, the top surface 161A_Tt of the connected gate line 161A on the first region R1 may be located at a vertical level higher than the top surface VS1_T of the first vertical structure VS1, the top surface VS2_T of the second vertical structure VS2, and the top surface 162_T of the separated gate line 162.

Referring to FIG. 4, an integrated circuit device 101 may be provided. The integrated circuit device 101 may include a connected gate line 161 on the first region R1 and a separated gate line 162 on the second region R2.

In some embodiments, the connected gate line 161 may include a first metal layer 161_M and a first filling metal layer 161_MF on the first metal layer 161_M. Specifically, each of the first connected portion 161_1, the second connected portion 161_2, and the common portion 161_C may include the first metal layer 161_M and the first filling metal layer 161_MF.

The first metal layer 161_M may be positioned between the first filling metal film 161_MF and the first gate dielectric film 152_1. The first metal layer 161_M may include a portion between each of the plurality of first nanosheets N1 and between each of the plurality of second nanosheets N2. The first metal layer 161_M may be disposed on the top surface and side surfaces of the first vertical structure VS1.

In some embodiments, the main gate portion 161M (see FIG. 2A) of the connected gate line 161 may include the first metal layer 161_M and the first filling metal layer 161_MF. The plurality of sub-gate portions 161S (see FIG. 2A) may include the first metal layer 161_M. In some embodiments, each of the main gate portion 161M and the plurality of sub-gate portions 161S may include the first metal layer 161_M and the first filling metal layer 161_MF.

In some embodiments, the separated gate line 162 may include a second metal layer 162_M and a second filling metal layer 162_MF on the second metal layer 162_M. Specifically, the first separated portion 162_1 may include the second metal layer 162_M and the second filling metal layer 162_MF. The second separated portion 162_2 may include the second metal layer 162_M and the second filling metal layer 162_MF.

The second metal layer 162_M may be positioned between the second filling metal layer 162_MF and the second gate dielectric film 152_2. The second metal layer 162_M may include a portion between each of the plurality of third nanosheets N3 and between each of the plurality of fourth nanosheets N4. The second metal layer 162_M may be disposed on the side surfaces of the second vertical structure VS2. The second metal layer 162_M may not be disposed on the top surface of the second vertical structure VS2.

In some embodiments, the main gate portion of the separated gate line 162 may include the second metal layer 162_M and the second filling metal layer 162_MF. The plurality of sub-gate portions of the separated gate line 162 may include the second metal layer 162_M. In some embodiments, each of the main gate portion and the plurality of sub-gate portions of the separated gate line 162 may include the second metal layer 162_M and the second filling metal layer 162_MF.

In some embodiments, the first metal layer 161_M and the second metal layer 162_M may include Ti. For example, the first metal layer 161_M and the second metal layer 162_M may include TIN, TiC, and/or TiAlC.

For example, the first filling metal layer 161_MF and the second filling metal layer 162_MF may include W. The first filling metal layer 161_MF and the second filling metal layer 162_MF may include the same metal.

In some embodiments, the first fin F1 and the second fin F2 may have the same conductivity type. For example, both the first fin F1 and the second fin F2 may have a P-type conductivity type. For example, both the first fin F1 and the second fin F2 may have an N-type conductivity type.

In some embodiments, the third fin F3 and the fourth fin F4 may have the same conductivity type. For example, both the third fin F3 and the fourth fin F4 may have a P-type conductivity type. For example, both the third fin F3 and the fourth fin F4 may have a N-type conductivity type.

In some embodiments, the first fin F1 and the second fin F2 may have a first conductivity type, and the third fin F3 and the fourth fin F4 may have a second conductivity type. When the first fin F1 and the second fin F2 have different conductivity types from the third fin F3 and the fourth fin F4, the first metal layer 161_M and the second metal layer 162_M may include different metal layers.

For example, the first fin F1 and the second fin F2 may have a P-type conductivity type, and the third fin F3 and the fourth fin F4 may have an N-type conductivity type. In this case, the first metal layer 161_M may include TiN, and the second metal layer 162_M may include TIC and/or TiAlC.

For example, the first fin F1 and the second fin F2 may have an N-type conductivity type, and the third fin F3 and the fourth fin F4 may have a P-type conductivity type. In this case, the first metal layer 161_M may include TiC and/or TiAlC, and the second metal layer 162_M may include TiN.

In some other embodiments, the first fin F1 and the fourth fin F4 may have a third conductivity type, and the second fin F2 and the third fin F3 may have a fourth conductivity type. For example, the first fin F1 and the fourth fin F4 may have a P-type conductivity type, and the second fin F2 and the third fin F3 may have an N-type conductivity type. For example, the first fin F1 and the fourth fin F4 may have an N-type conductivity type, and the second fin F2 and the third fin F3 may have a P-type conductivity type.

Figure 5:
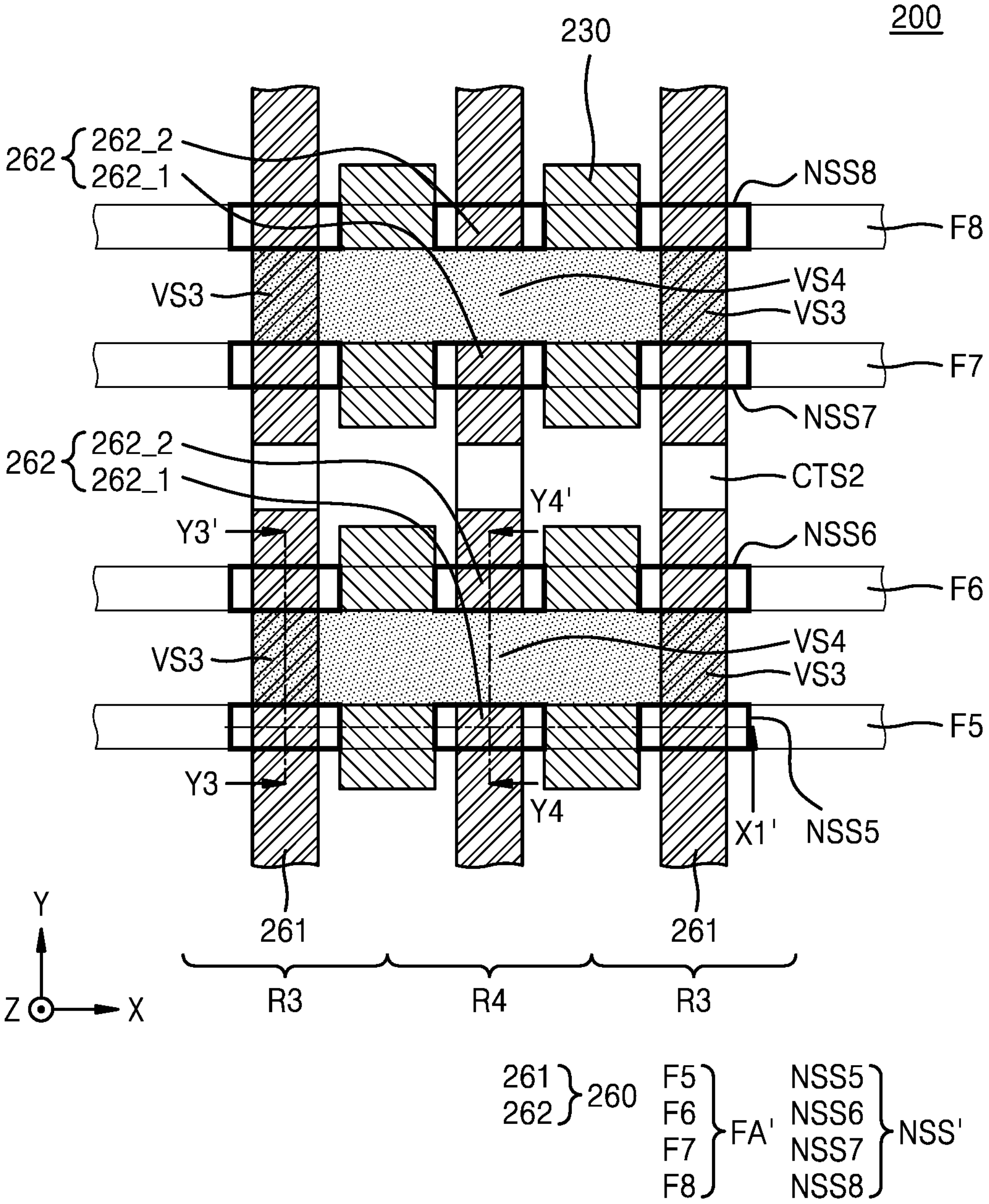
FIG. 5 is a plane layout diagram of an integrated circuit device according to some embodiments.
Figure 6:
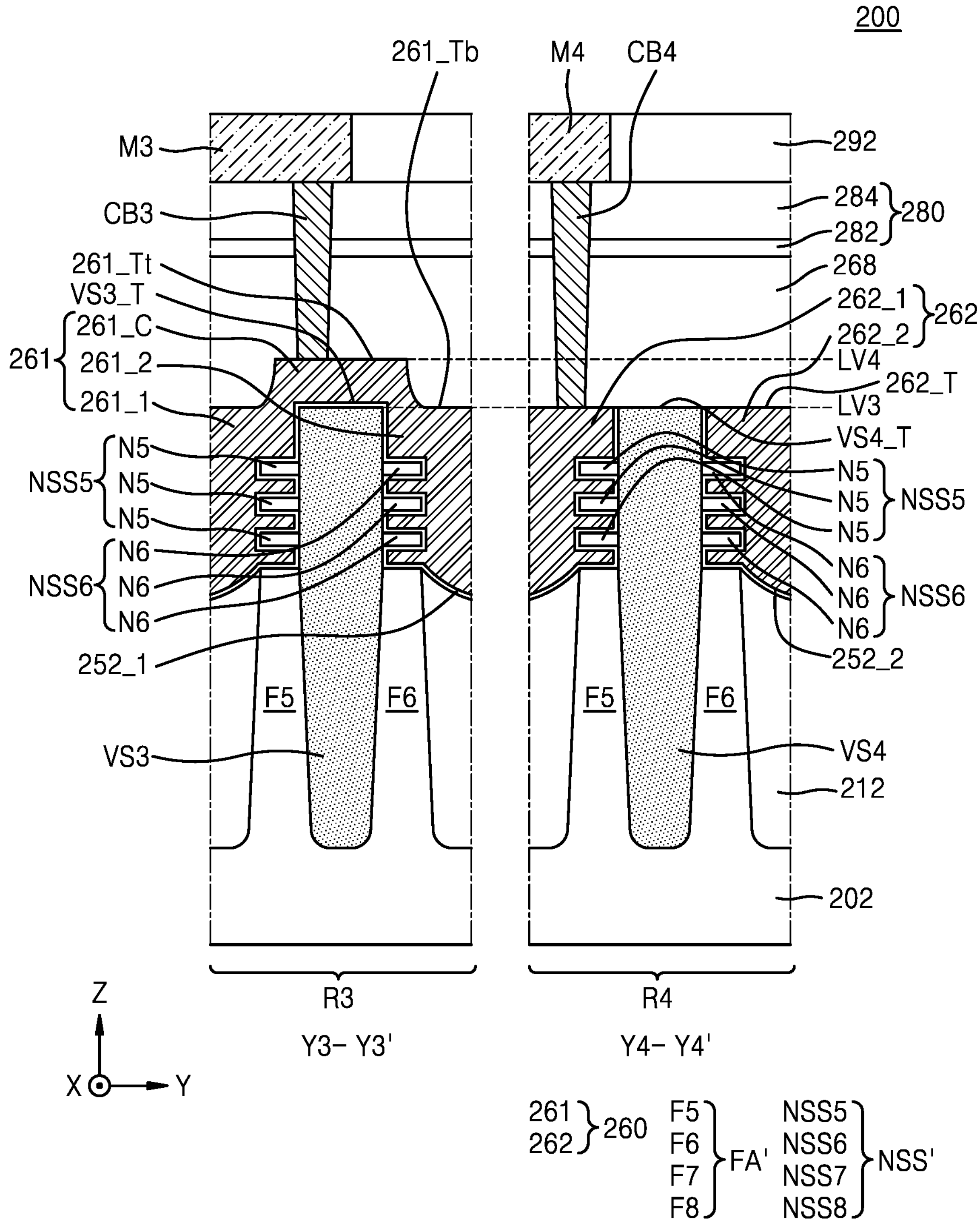
FIG. 6 is a cross-sectional view of an integrated circuit device according to some embodiments.

FIG. 5 is a plane layout diagram of an integrated circuit device 200 according to some embodiments. FIG. 6 is a cross-sectional view of an integrated circuit device 200 according to some embodiments. Specifically, FIG. 6 is a cross-sectional view taken along lines Y3-Y3' and Y4-Y4' of FIG. 5. Hereinafter, the differences from the integrated circuit device 100 described with reference to FIGS. 1 and 2A to 2C are mainly described.

Referring to FIGS. 5 and 6, an integrated circuit device 200 may be provided. The integrated circuit device 200 may include a plurality of fin-type active regions FA' extending in the first horizontal direction (X direction) on a substrate 202. The substrate 202 may include a third region R3 and a fourth region R4 adjacent to each other in the first horizontal direction (X direction).

In some embodiments, integrated circuit device 200 may include a first wiring line M3, a second wiring line M4, a first gate contact CB3, a second gate contact CB4, a second cutting structure CTS2, an upper insulating film 292, an upper insulating structure 280 (an etch stop film 282 and an interlayer insulating film 284), a capping insulating patterns 268, a gate dielectric film 252 (first gate dielectric film 252_1, second gate dielectric film 252_2), source/drain regions 230, and device isolation film 212. Descriptions of each of the above components may refer to those described with reference to FIGS. 1, 2A to 2C.

The plurality of fin-type active regions FA' may extend in the first horizontal direction (X direction), and may include a fifth fin F5, a sixth fin F6, a seventh fin F7, and an eighth fin F8 arranged in the second horizontal direction (Y direction). In some embodiments, the fifth fin F5 may be adjacent to the sixth fin F6 in the second horizontal direction (Y direction). The seventh fin F7 may be adjacent to the eighth fin F8 in the second horizontal direction (Y direction).

In some embodiments, the fifth fin F5, the sixth fin F6, the seventh fin F7, and the eighth fin F8 may extend in the first horizontal direction (X direction) across the third region R3 and the fourth region R4.

As illustrated in FIGS. 5 and 6, a plurality of gate lines 260 extending in the second horizontal direction (Y direction) may be arranged on the plurality of fin-type active regions FA'. The plurality of nanosheet stacks NSS' may be arranged on top of a fin top surface FT of each of a plurality of fin-type active regions FA' in regions where the plurality of fin-type active regions FA' intersect the plurality of gate lines 260.

Specifically, a fifth nanosheet stack NSS5 may include a plurality of fifth nanosheets N5 overlapping each other in the vertical direction (Z direction) on the fifth fin F5. Each of the plurality of fifth nanosheets N5 may be referred to as a fifth channel region. A sixth nanosheet stack NSS6 may include a plurality of sixth nanosheets N6 overlapping each other in the vertical direction (Z direction) on the sixth fin F6. Each of the plurality of sixth nanosheets N6 may be referred to as a sixth channel region. A seventh nanosheet stack NSS7 may include a plurality of seventh nanosheets N7 overlapping each other in the vertical direction (Z direction) on the seventh fin F7. Each of the plurality of seventh nanosheets N7 may be referred to as a seventh channel region. An eighth nanosheet stack NSS8 may include a plurality of eighth nanosheets N8 overlapping each other in the vertical direction (Z direction) on the eighth fin F8. Each of the plurality of eighth nanosheets N8 may be referred to as an eighth channel region.

As illustrated in FIGS. 5 and 6, a third vertical structure VS3 may be placed between the fifth fin F5 and the sixth fin F6 on the third region R3 of the substrate 202. The third vertical structure VS3 may be placed between the fifth nanosheet stack NSS5 and the sixth nanosheet stack NSS6. The third vertical structure VS3 may be in contact with the plurality of fifth nanosheets N5 included in the fifth nanosheet stack NSS5. The third vertical structure VS3 may be in contact with a side surface of each of the plurality of fifth nanosheets N5 included in the fifth nanosheet stack NSS5. The third vertical structure VS3 may be in contact with the plurality of sixth nanosheets N6 included in the sixth nanosheet stack NSS6. The third vertical structure VS3 may be in contact with a side surface of each of the plurality of sixth nanosheets N6 included in the sixth nanosheet stack NSS6. For example, the third vertical structure VS3 may be in contact with the fifth channel region and the sixth channel region.

Likewise, a third vertical structure VS3 may be positioned between the seventh fin F7 and the eighth fin F8 on the third region R3 of the substrate 202. The third vertical structure VS3 may be positioned between the seventh nanosheet stack NSS7 and the eighth nanosheet stack NSS8. The third vertical structure VS3 may be in contact with the plurality of seventh nanosheets N7 included in the seventh nanosheet stack NSS7. The third vertical structure VS3 may be in contact with the plurality of eighth nanosheets N8 included in the eighth nanosheet stack NSS8. For example, the third vertical structure VS3 may be in contact with the seventh channel region and the eighth channel region.

A fourth vertical structure VS4 may be positioned between the fifth fin F5 and the sixth fin F6 on the fourth region R4 of the substrate 202. The fourth vertical structure VS4 may be placed between the fifth nanosheet stack NSS5 and the sixth nanosheet stack NSS6. The fourth vertical structure VS4 may be in contact with the plurality of fifth nanosheets N5 included in the fifth nanosheet stack NSS5. The fourth vertical structure VS4 may be in contact with a side surface of each of the plurality of fifth nanosheets N5 included in the fifth nanosheet stack NSS5. The fourth vertical structure VS4 may be in contact with the plurality of sixth nanosheets N6 included in the sixth nanosheet stack NSS6. The fourth vertical structure VS4 may be in contact with a side surface of each of the plurality of sixth nanosheets N6 included in the sixth nanosheet stack NSS6. For example, the fourth vertical structure VS4 may be in contact with the fifth channel region and the sixth channel region.

Likewise, the fourth vertical structure VS4 may be positioned between the seventh fin F7 and the eighth fin F8 on the fourth region R4 of the substrate 202. The fourth vertical structure VS4 may be positioned between the seventh nanosheet stack NSS7 and the eighth nanosheet stack NSS8. The fourth vertical structure VS4 may be in contact with the plurality of seventh nanosheets N7 included in the seventh nanosheet stack NSS7. The fourth vertical structure VS4 may be in contact with the plurality of eighth nanosheets N8 included in the eighth nanosheet stack NSS8. For example, the fourth vertical structure VS4 may be in contact with the seventh channel region and the eighth channel region.

As illustrated in FIG. 6, a top surface VS3_T of the third vertical structure VS3 and a top surface VS4_T of the fourth vertical structure VS4 may be located at the same vertical level. Specifically, both the top surface VS3_T of the third vertical structure VS3 and the top surface VS4_T of the fourth vertical structure VS4 may be located at a third vertical level LV3.

As illustrated in FIGS. 5 and 6, a connected gate line 261 and a separated gate line 262 that overlap in the second horizontal direction (Y direction) may be placed on the substrate 202. The connected gate line 261 and the separated gate line 262 may not overlap each other in the second horizontal direction (Y direction). Specifically, the connected gate line 261 and the separated gate line 262 may overlap in the first horizontal direction (X direction).

The connected gate line 261 may be placed on the third region R3 of the substrate 202. The connected gate line 261 may at least partially surround the plurality of fifth nanosheets N5 and the plurality of sixth nanosheets N6 on the fifth fin F5 and the sixth fin F6 on the third region R3.

For example, the connected gate line 261 may at least partially surround the fifth channel region and the sixth channel region on the fifth fin F5 and the sixth fin F6.

Specifically, the connected gate line 261 may include a first connected portion 261_1, a second connected portion 261_2, and a common portion 261_C. The first connected portion 261_1 may at least partially surround a plurality of fifth nanosheets N5 on the fifth fin F5. For example, the first connected portion 261_1 may surround the fifth channel region on the fifth fin F5. The second connected portion 261_2 may at least partially surround the plurality of sixth nanosheets N6 on the sixth fin F6. For example, the second connected portion 261_2 may surround the sixth channel region on the sixth fin F6. The first connected portion 261_1 and the second connected portion 261_2 may each be placed on side surfaces of the third vertical structure VS3. The common portion 261_C may connect the first connected portion 261_1 to the second connected portion 261_2. The common portion 261_C may be placed on the top surface VS3_T of the third vertical structure VS3. The first connected portion 261_1, the second connected portion 261_2, and the common portion 261_C of the connected gate line 261 may be integrally formed.

The first connected portion 261_1 may overlap with the fifth nanosheet stack NSS5 in the vertical direction (Z direction). The second connected portion 261_2 may overlap with the sixth nanosheet stack NSS6 in the vertical direction (Z direction). The common portion 261_C may overlap with the third vertical structure VS3 in the vertical direction (Z direction). The common portion 261_C may be placed on the top surface of the third vertical structure VS3. The third vertical structure VS3 may be placed between the first connected portion 261_1 and the second connected portion 261_2. The third vertical structure VS3 may overlap with the first connected portion 261_1 and the second connected portion 261_2 in the second horizontal direction (Y direction).

Likewise, the connected gate line 261 may at least partially surround the plurality of seventh nanosheets N7 and the plurality of eighth nanosheets N8 on the seventh fin F7 and the eighth fin F8 on the third region R3. For example, the connected gate line 261 may at least partially surround the seventh channel region and the eighth channel region on the seventh fin F7 and the eighth fin F8.

The separated gate line 262 may be placed on the fourth region R4 of the substrate 202. The separated gate line 262 may at least partially surround the plurality of fifth nanosheets N5 and the plurality of sixth nanosheets N6 on the fifth fin F5 and the sixth fin F6 on the fourth region R4. For example, the separated gate line 262 may surround the fifth channel region and the sixth channel region on the fifth fin F5 and the sixth fin F6 on the fourth region R4.

Specifically, the separated gate line 262 may include a first separated portion 262_1, and a second separated portion 262_2. The first separated portion 262_1 may at least partially surround the plurality of fifth nanosheets N5 on the fifth fin F5. For example, the first separated portion 262_1 may surround the fifth channel region on the fifth fin F5. The second separated portion 262_2 may at least partially surround the plurality of sixth nanosheets N6 on the sixth fin F6. The second separated portion 262_2 may surround the sixth channel region on the sixth fin F6. The first separated portion 262_1 may overlap with the fifth nanosheet stack NSS5 in the vertical direction (Z direction). The second separated portion 262_2 may overlap with the sixth nanosheet stack NSS6 in the vertical direction (Z direction). The first separated portion 262_1 and the second separated portion 262_2 may overlap with the fourth vertical structure VS4 in the second horizontal direction (Y direction).

In some embodiments, the first separated portion 262_1 and the second separated portion 262_2 may be spaced apart from each other in the second horizontal direction (Y direction) with the fourth vertical structure VS4 positioned therebetween. Specifically, the fourth vertical structure VS4 may insulate the first separated portion 262_1 and the second separated portion 262_2. The first separated portion 262_1 and the second separated portion 262_2 may each be placed on side surfaces of the fourth vertical structure VS4. The separated gate line 262 may not be placed on the top surface VS4_T of the fourth vertical structure VS4.

In some embodiments, a top surface of the connected gate line 261 may be located at or above the third vertical level LV3 and at or below the fourth vertical level LV4 on the third region R3.

An uppermost portion 261_Tt of the top surface of the connected gate line 261 may be located at a vertical level higher than the top surface VS3_T of the third vertical structure VS3. Specifically, the uppermost portion 261_Tt of the top surface of the connected gate line 261 may be located at the fourth vertical level LV4 higher than the third vertical level LV3.

A lowermost portion 261_Tb of the top surface of the connected gate line 261 may be located at the same vertical level as the top surface VS3_T of the third vertical structure VS3. Specifically, the lowermost portion 261_Tb of the top surface of the connected gate line 261 may be located at the third vertical level LV3.

In some embodiments, a top surface 262_T of the separated gate line 262 may be located at the same vertical level as the top surface VS4_T of the fourth vertical structure VS4 on the fourth region R4. Specifically, the top surface 262_T of the separated gate line 262 may be located at the third vertical level LV3. For example, an uppermost portion of the top surface 262_T of the separated gate line 262 may be located at the third vertical level LV3.

In other words, the uppermost portion 261_Tt of the top surface of the connected gate line 261 on the third region R3 may be located at the vertical level higher than the top surface VS3_T of the third vertical structure VS3, the top surface VS4_T of the fourth vertical structure VS4, and the top surface 262_T of the separated gate line 262. The lowermost portion 261_Tb of the top surface of the connected gate line 261 may be located at the same vertical level as the top surface VS3_T of the third vertical structure VS3, the top surface VS4_T of the fourth vertical structure VS4, and the top surface 262_T of the separated gate line 262.

In some embodiments, the uppermost portion 261_Tt of the top surface of the connected gate line 261 on the third region R3 may overlap with the third vertical structure VS3 in the vertical direction (Z direction).

Figure 7:
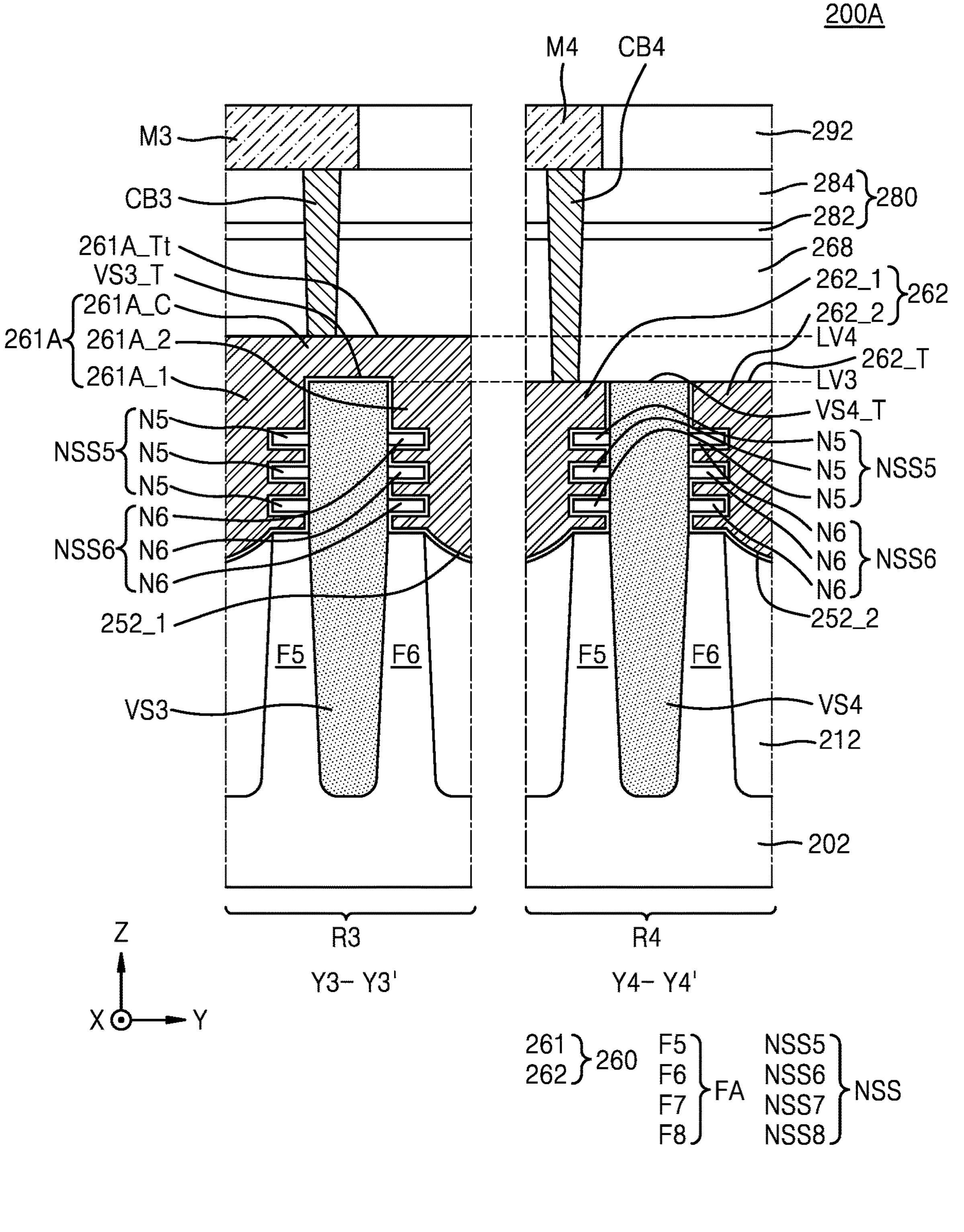
FIG. 7 is a cross-sectional view of an integrated circuit device according to some embodiments.

FIG. 7 is a cross-sectional view of an integrated circuit device 200A according to some embodiments. Hereinafter, the differences from the integrated circuit device 200 described with reference to FIGS. 5 and 6 are mainly described.

Referring to FIG. 7, an integrated circuit device 200A may be provided. The integrated circuit device 200A may include a connected gate line 261A that at least partially surrounds the plurality of fifth nanosheets N5 and the plurality of sixth nanosheets N6 on the third region R3.

Specifically, the connected gate line 261A may include a first connected portion 261A_1, a second connected portion 261A_2, and a common portion 261A_C that may be integrally formed. The first connected portion 261A_1 and the second connected portion 261A_2 may overlap with the common portion 261A_C in the vertical direction (Z direction).

In some embodiments, a top surface 261A_T of the connected gate line 261A may be located at a vertical level higher than the top surface VS3_T of the third vertical structure VS3 on the third region R3. The top surface 261A_T of the connected gate line 261A may be located at a vertical level higher than the third vertical level LV3. The top surface 261A_T of the connected gate line 261A may be located at the fourth vertical level LV4.

In some embodiments, a top surface of the common portion 261A_C of the connected gate line 261A may be located at a vertical level higher than the third vertical level LV3. The top surface of the common portion 261A_C of the connected gate line 261A may be located at the fourth vertical level LV4.

In other words, the top surface 261A_T of the connected gate line 261A on the first region R1 may be located at the vertical level higher than the top surface VS3_T of the third vertical structure VS3, the top surface VS4_T of the fourth vertical structure VS4, and the top surface 262_T of the separated gate line 262.

FIGS. 8A, 8B, 9A, 9B, 10A, 10B, 11, 12A, 12B, 13A, and 13B are cross-sectional views shown according to a process sequence to explain a manufacturing method of an integrated circuit device according to some embodiments. Specifically, FIGS. 8A, 8B, 9A, 9B, 10A, 10B, 11, 12A, 12B, 13A, and 13B are cross-sectional views corresponding to FIG. 2A. FIG. 8B, FIG. 9B, FIG. 10B, FIG. 11, FIG. 12B, and FIG. 13B are cross-sectional views corresponding to FIG. 2C.

Figure 8A:
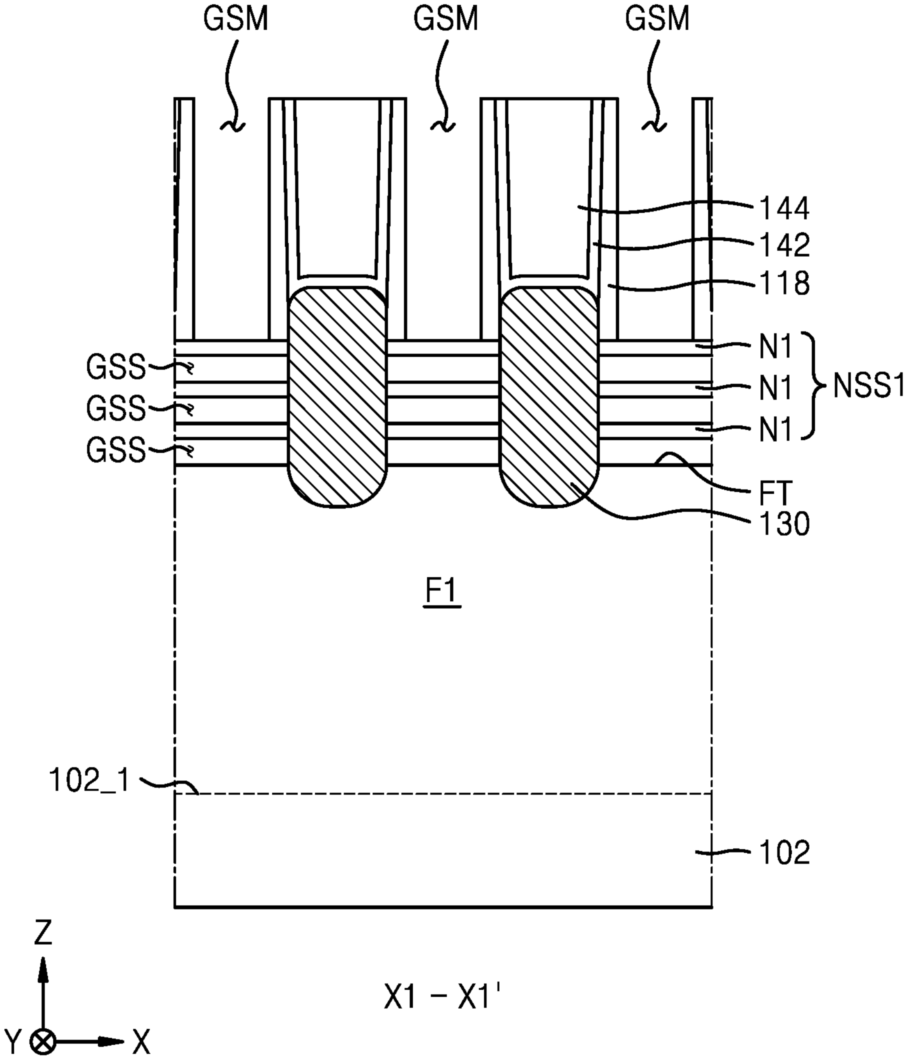
FIGS. 8A, 8B, 9A, 9B, 10A, 10B, 11, 12A, 12B, 13A, and 13B are cross-sectional views of a process sequence to explain a manufacturing method of an integrated circuit device according to some embodiments.
Figure 8B:
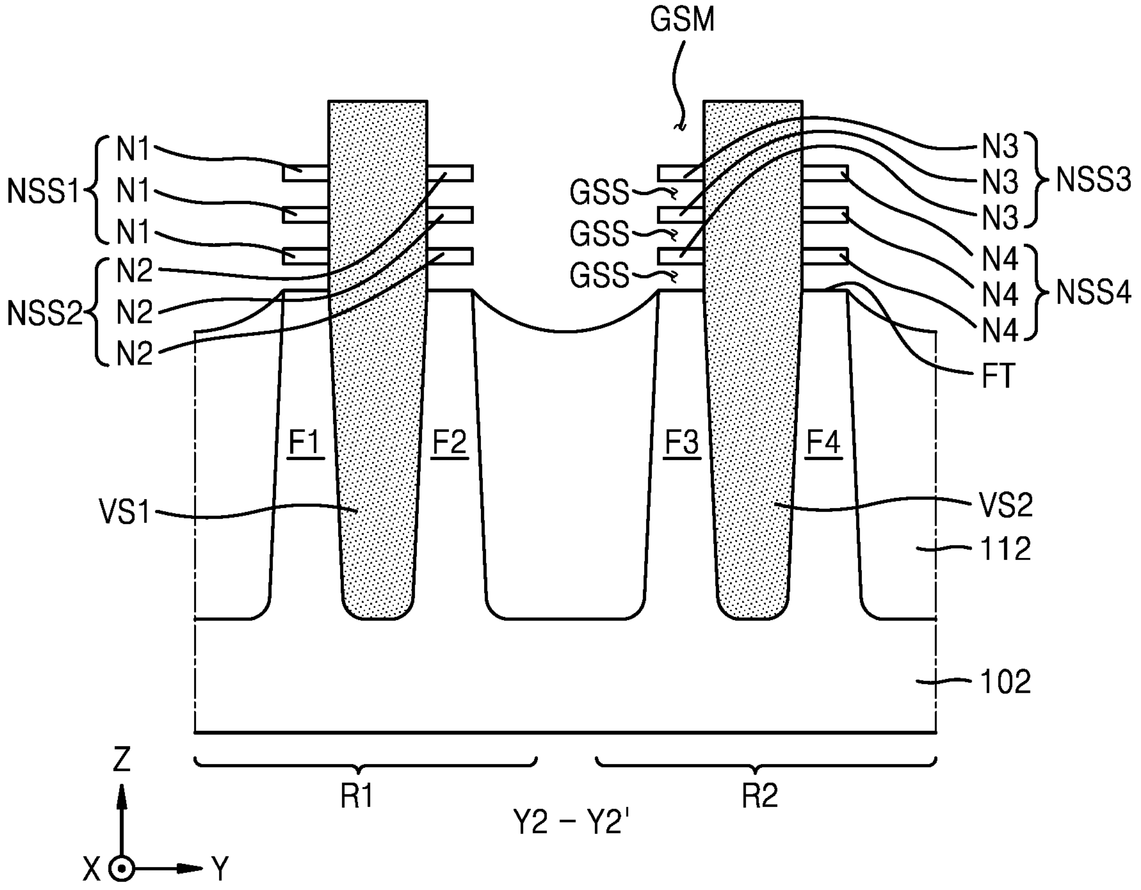

Referring to FIGS. 8A and 8B, a first fin F1, a second fin F2, a third fin F3, and a fourth fin F4 may be defined on a first surface 102_1 of a substrate 102 by etching a portion of the substrate 102. Then, a device isolation film 112 covering or overlapping a sidewall of each of the first fin F1, the second fin F2, the third fin F3, and the fourth fin F4 may be formed.

A plurality of nanosheet stacks NSS including a plurality of nanosheets N1, N2, N3, and N4 may be formed on a fin top surface FT of each of the first fin F1, the second fin F2, the third fin F3, and the fourth fin F4.

A first vertical structure VS1 contacting a first nanosheet stack NSS1 and a second nanosheet stack NSS2 may be formed, and a second vertical structure VS2 contacting the third nanosheet stack NSS3 and the fourth nanosheet stack NSS4 may be formed. The first vertical structure VS1 and the second vertical structure VS2 may be formed by providing a dielectric material between the first nanosheet stack NSS1 and the second nanosheet stack NSS2 and between the third nanosheet stack NSS3 and the fourth nanosheet stack NSS4.

A main gate space GSM may be formed on the plurality of nanosheet stacks NSS, and a plurality of sub-gate spaces GSS may be formed between the plurality of nanosheets N1, N2, N3, and N4 and between the plurality of nanosheets N1, N2, N3, and N4 and the fin top surface FT.

Figure 9A:
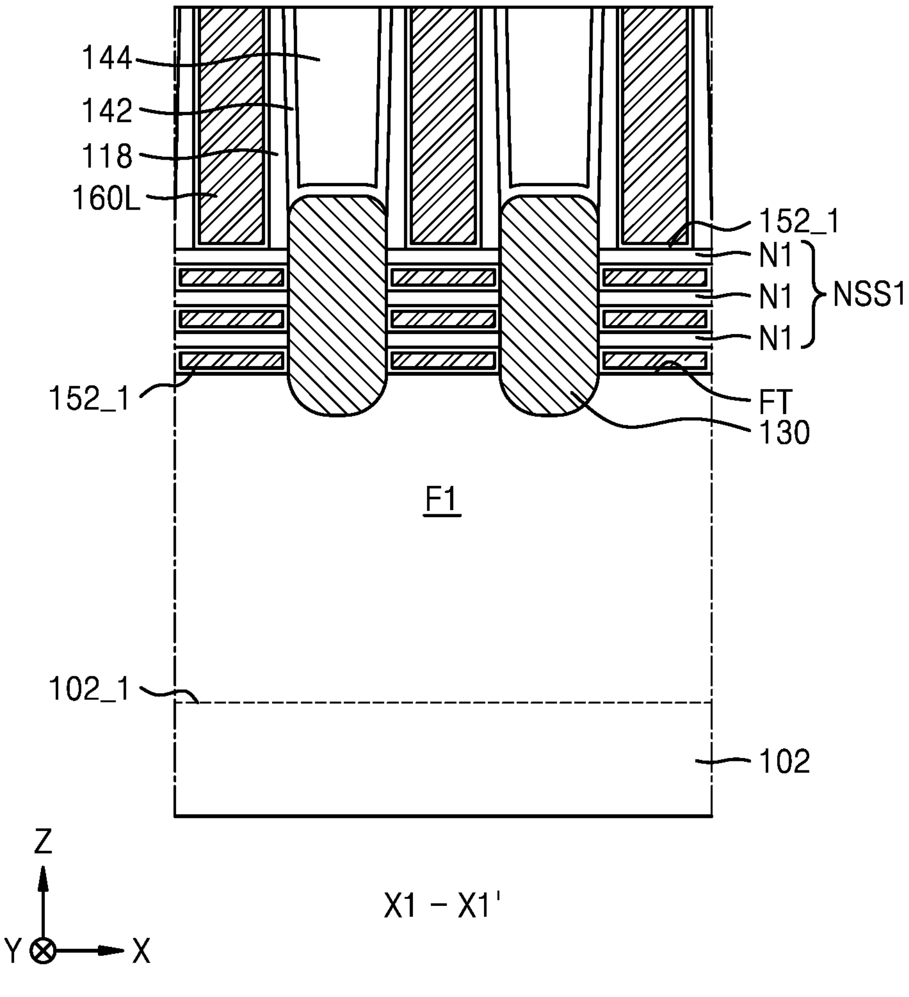
Figure 9B:
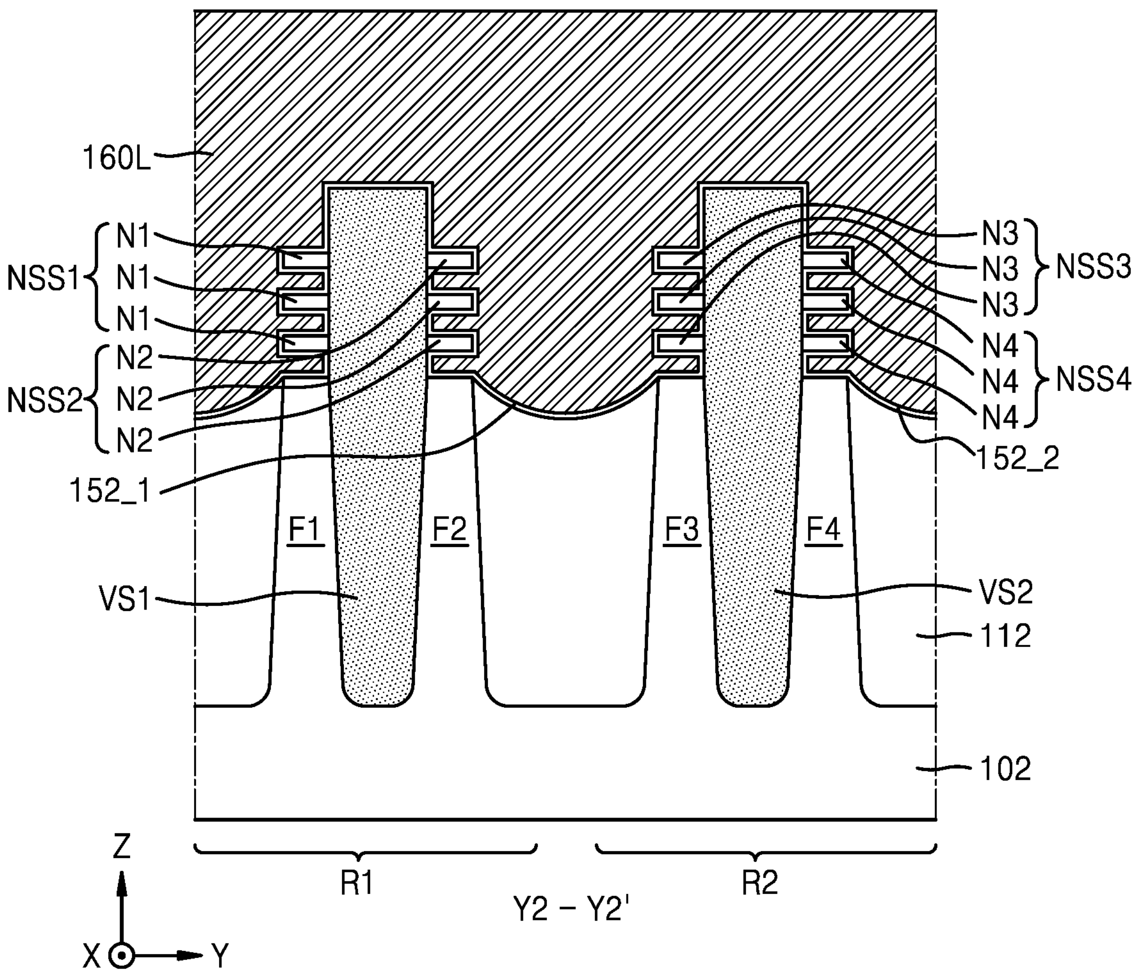

Referring to FIGS. 9A and 9B, gate dielectric films 152_1 and 152_2 are formed on the plurality of nanosheets N1, N2, N3, and N4, the first vertical structure VS1, and the second vertical structure VS2. Specifically, on the first region R1 of the substrate 102, a first gate dielectric film 152_1 may be formed on the top surface of the device isolation film 112, the top surface, the side surface, and the bottom surface of each of the plurality of first nanosheets N1 and the plurality of second nanosheets N2, and the side surfaces and the top surface of the first vertical structure VS1. On the second region R2 of the substrate 102, a second gate dielectric film 152_2 may be formed on the top surface of the device isolation film 112, the top surface, the side surface, and the bottom surface of each of the plurality of third nanosheets N3 and the plurality of fourth nanosheets N4, and the side surfaces and the top surface of the second vertical structure VS2.

Subsequently, a gate-forming conductive layer 160L may be formed on the gate dielectric films 152_1 and 152_2. The gate-forming conductive layer 160L may be formed on the top surface of the device isolation film 112, the top surface, the side surface, and the bottom surface of each of the plurality of nanosheets N1, N2, N3, and N4, the side surfaces and the top surface of the first vertical structure VS1, and the side surfaces and the top surface of the second vertical structure VS2. The top surface of the gate-forming conductive layer 160L may be positioned at the same vertical level as the top surface of each of the insulating liner 142 and the inter-gate insulating film 144.

Figure 10A:
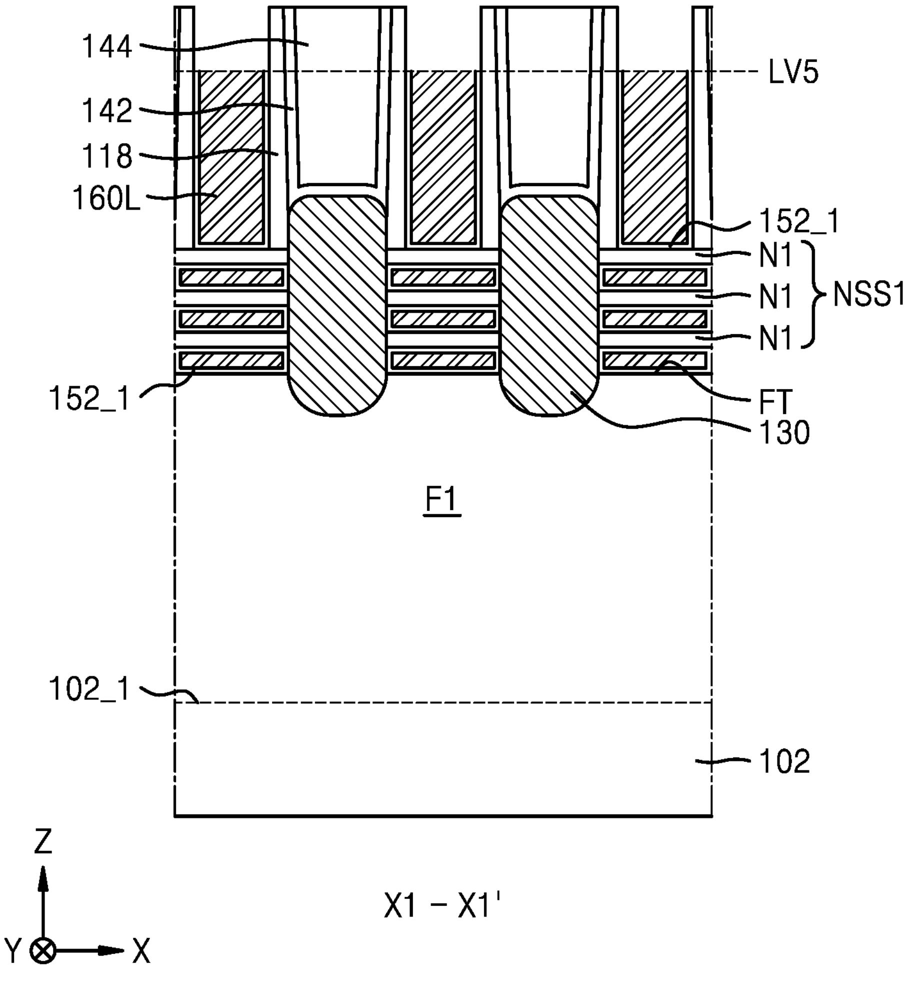
Figure 10B:
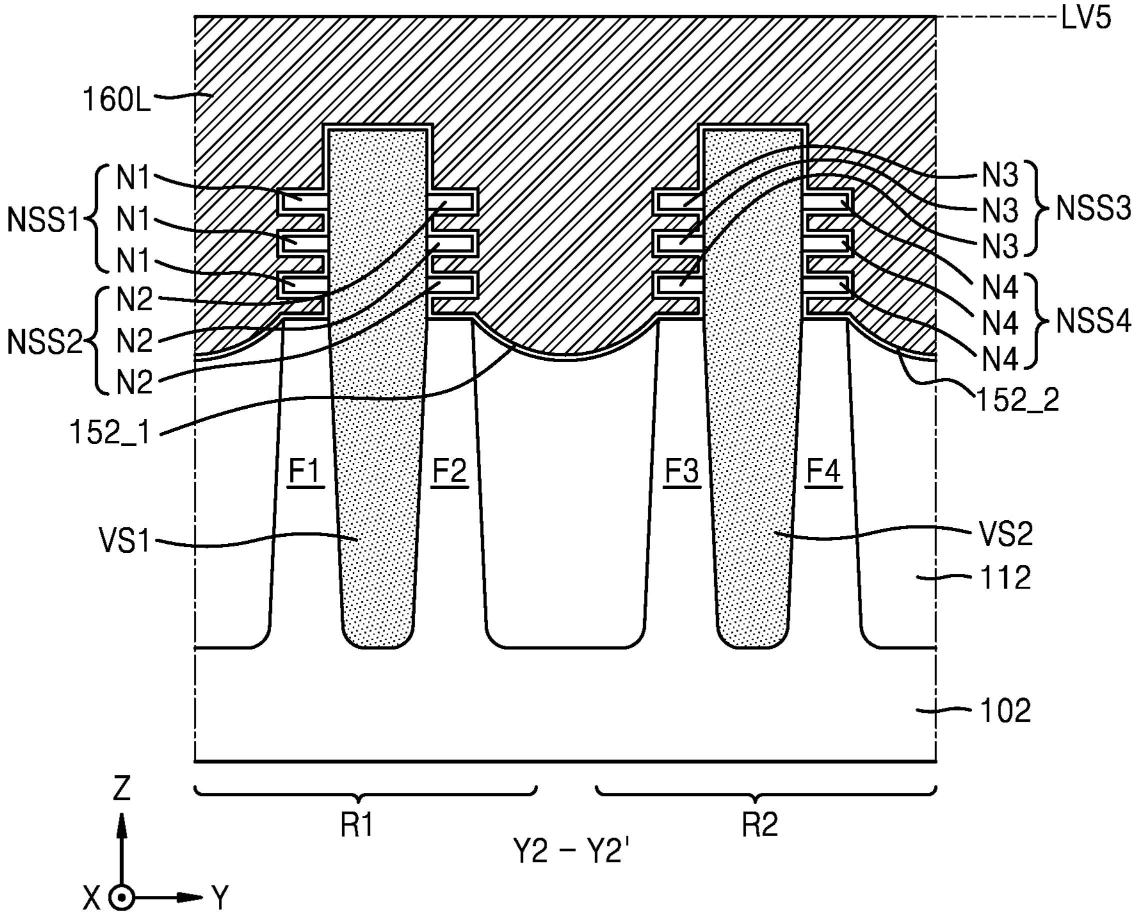

Referring to FIGS. 10A and 10B, a portion of the gate-forming conductive layer 160L may be removed. As a result, the top surface of the gate-forming conductive layer 160L may be located at a fifth vertical level LV5.

Figure 11:
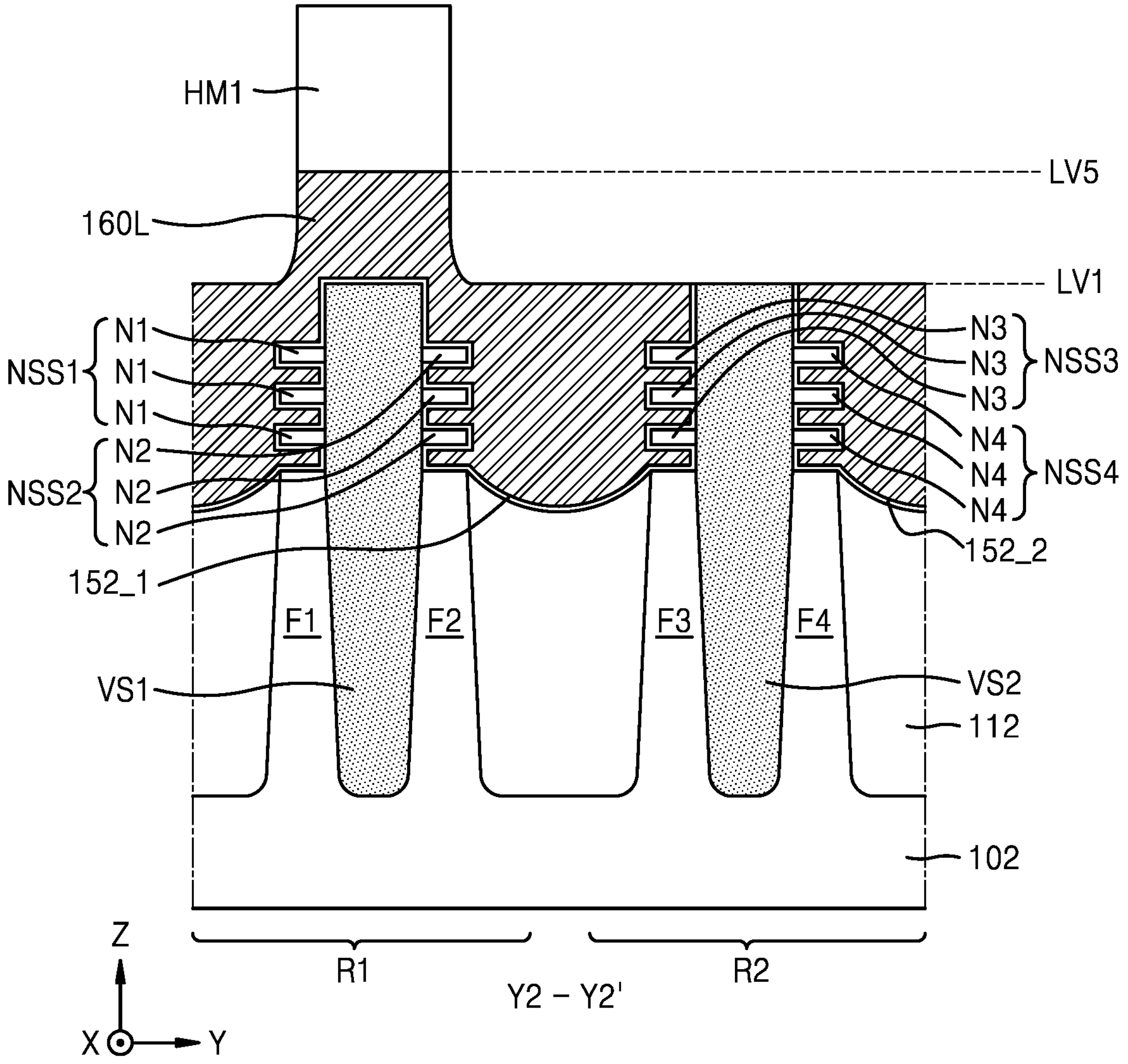

Referring to FIG. 11, a first hardmask film HM1 may be formed on the first region R1 of the substrate 102, and the gate-forming conductive layer 160L and the gate dielectric film 152 may be etched using the first hardmask film HM1 as a mask. Through the above process, the gate-forming conductive layer 160L and the second gate dielectric film 152_2 on the top surface of the second vertical structure VS2 may be etched to expose the top surface of the second vertical structure VS2. Through the above process, the top surface of the gate-forming conductive layer 160L on the first region R1 may include a portion located at the first vertical level LV1. Through the above process, the top surface of the gate-forming conductive layer 160L on the second region R2 may be positioned at the first vertical level LV1.

Figure 12A:
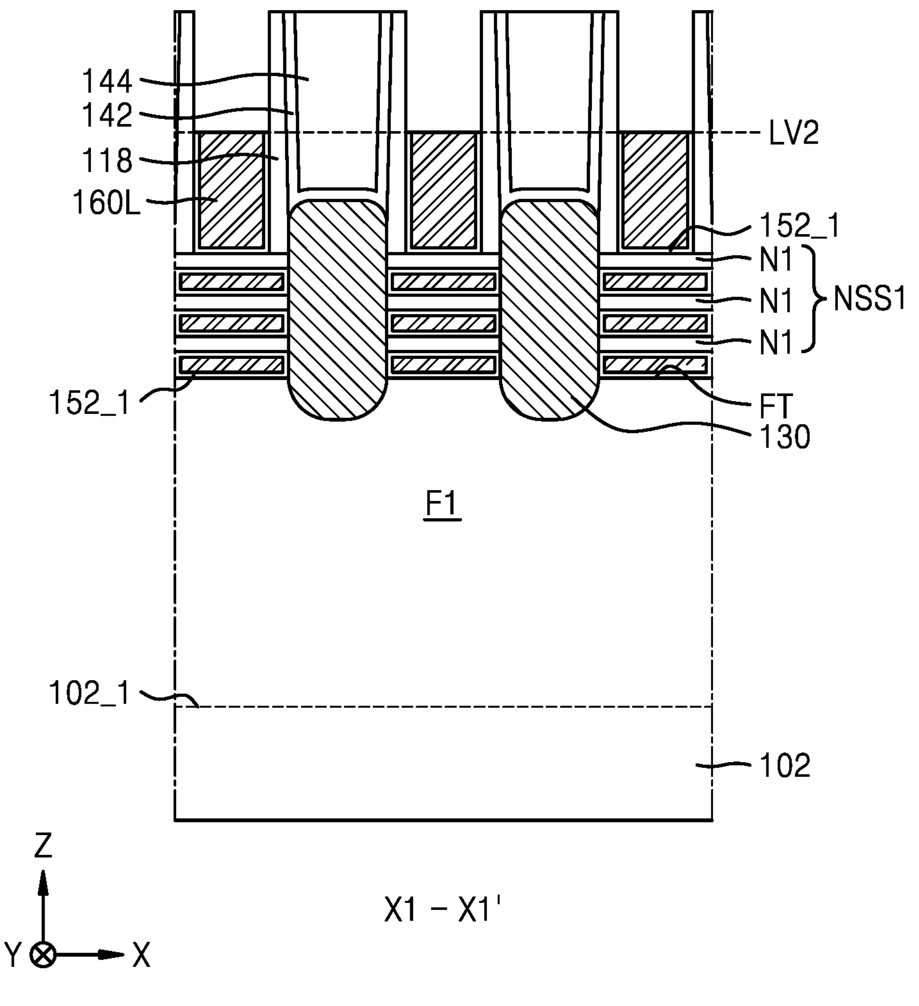
Figure 12B:
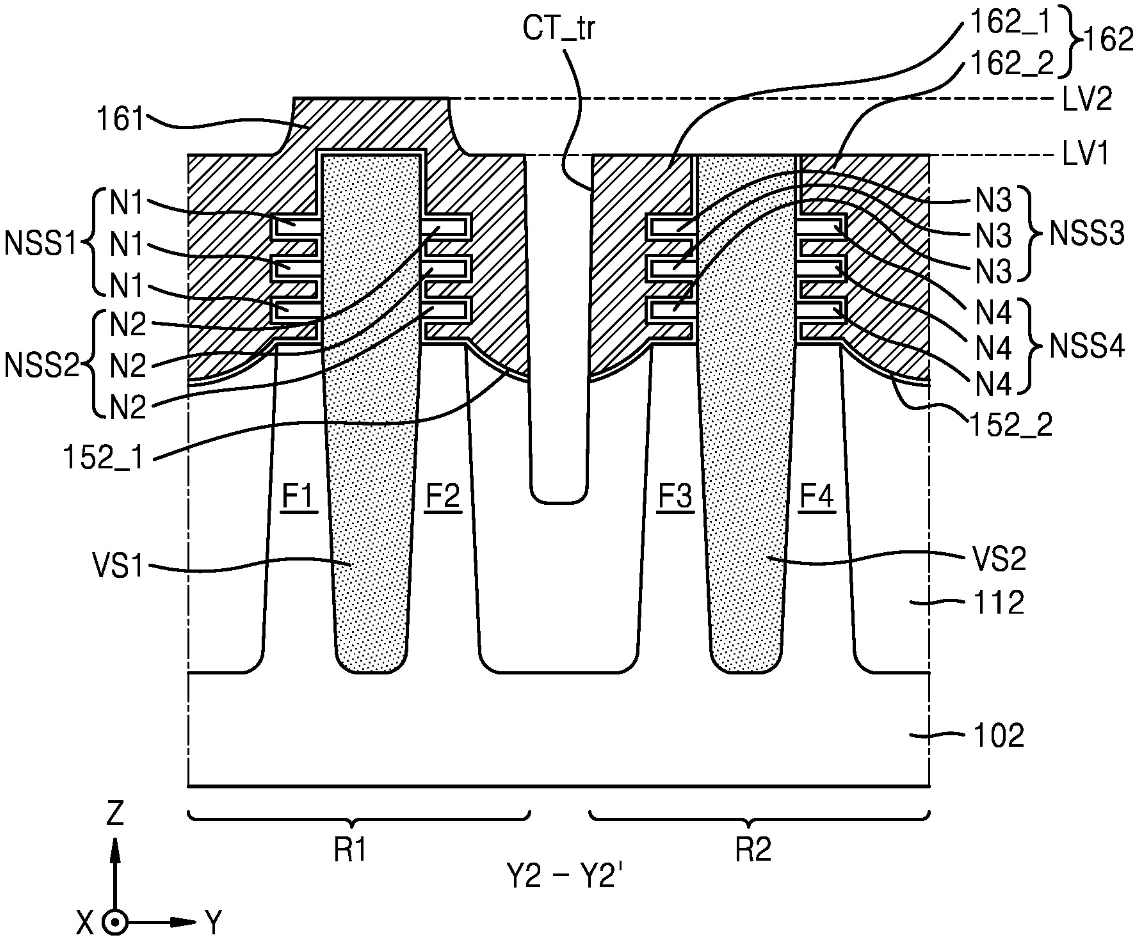

Referring to FIGS. 12A and 12B, the uppermost portion of the top surface of the gate-forming conductive layer 160L may be located at the second vertical level LV2 after removing the first hardmask film HM1 and etching the gate-forming conductive layer 160L under the first hardmask film HM1. Subsequently, a cutting trench CT_tr may be formed by etching the gate-forming conductive layer 160L and the device isolation film 112 between the second fin F2 and the third fin F3.

Through the above process, the connected gate line 161 may be formed on the first region R1 and the separated gate line 162 may be formed on the second region R2. The uppermost portion of the top surface of the connected gate line 161 may be located at the second vertical level LV2, and the lowermost portion of the top surface of the connected gate line 161 and the top surface of the separated gate line 162 may be located at the first vertical level LV1.

Figure 13A:
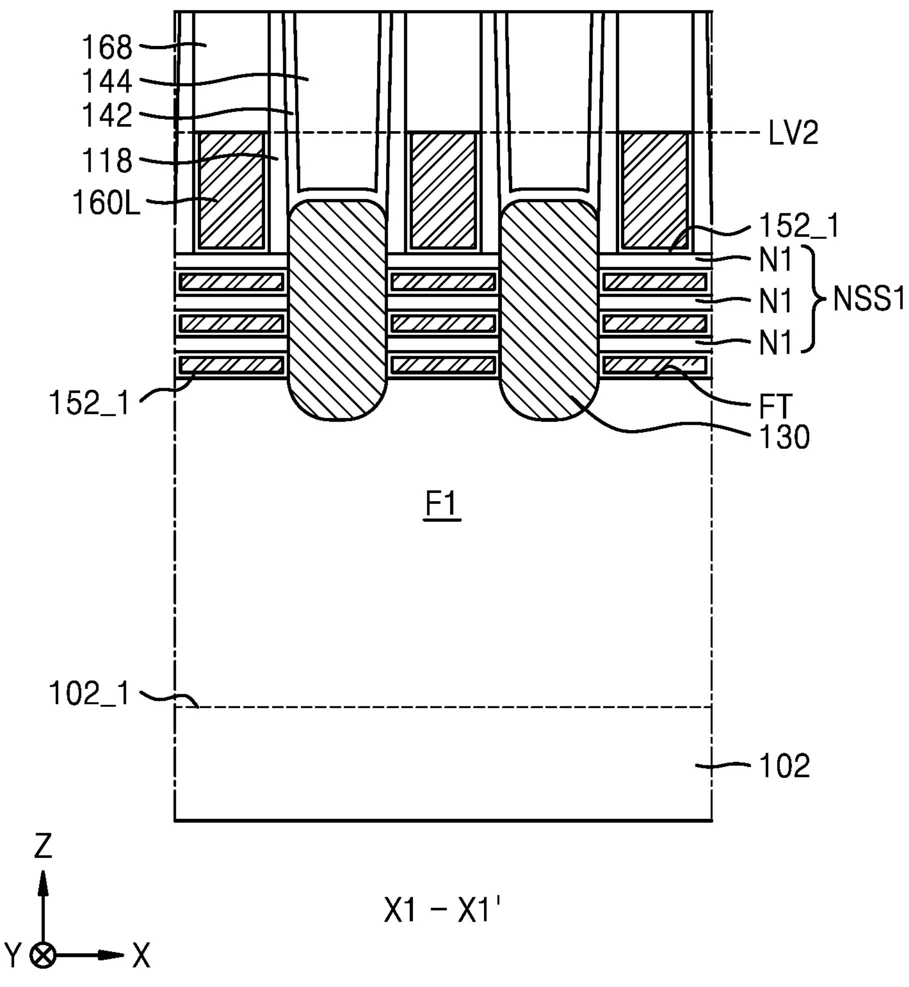
Figure 13B:
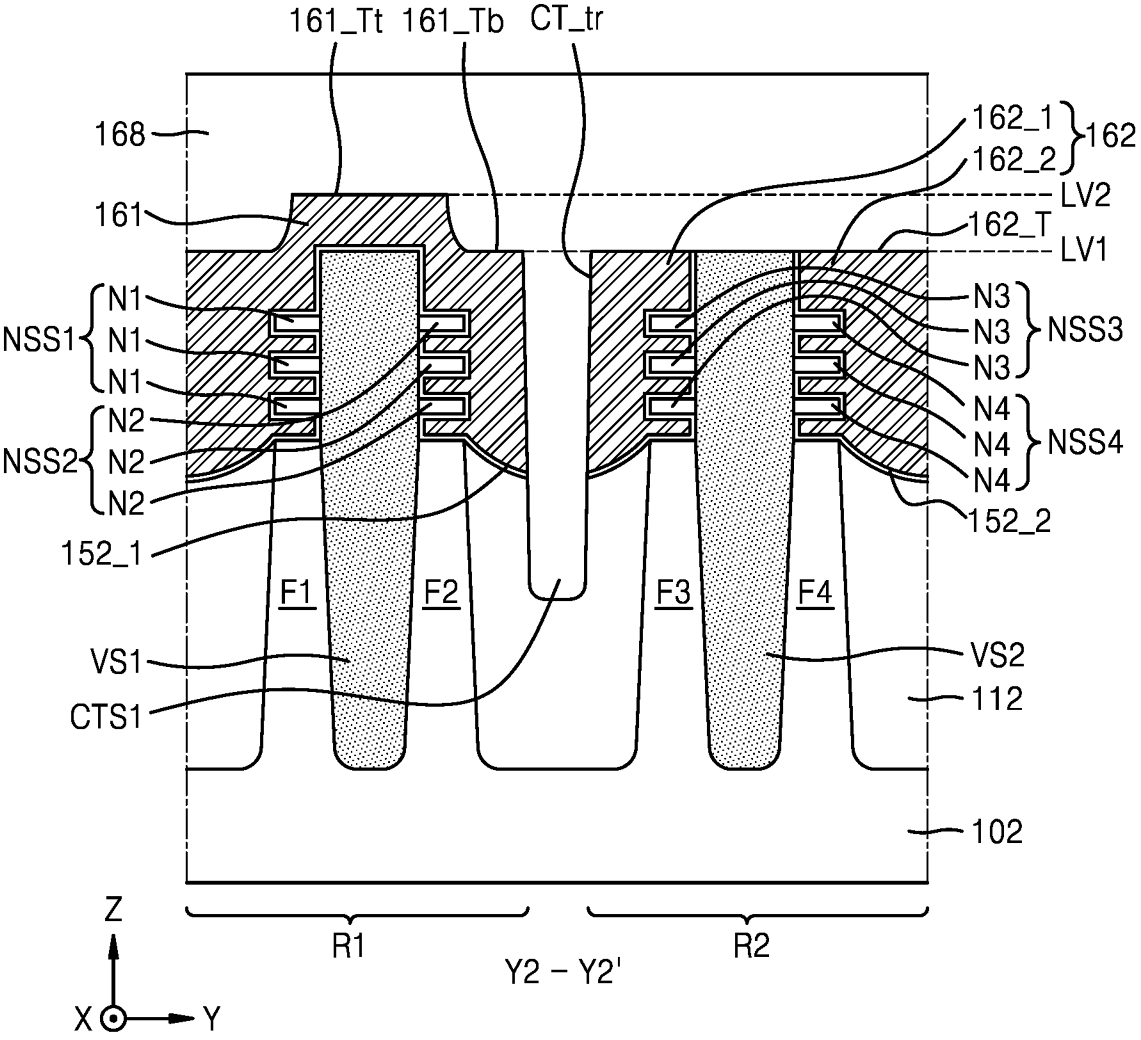

Referring to FIGS. 13A and 13B, the first cutting structure CTS1 may be formed in the cutting trench CT_tr, and the capping insulating pattern 168 may be formed on the top surface of the connected gate line 161, the top surface of the separated gate line 162, and the top surface of the second vertical structure VS2.

Subsequently, a follow-up process may be performed to manufacture the integrated circuit device 100 described with reference to FIGS. 1 and 2A to 2C.

Figure 14:
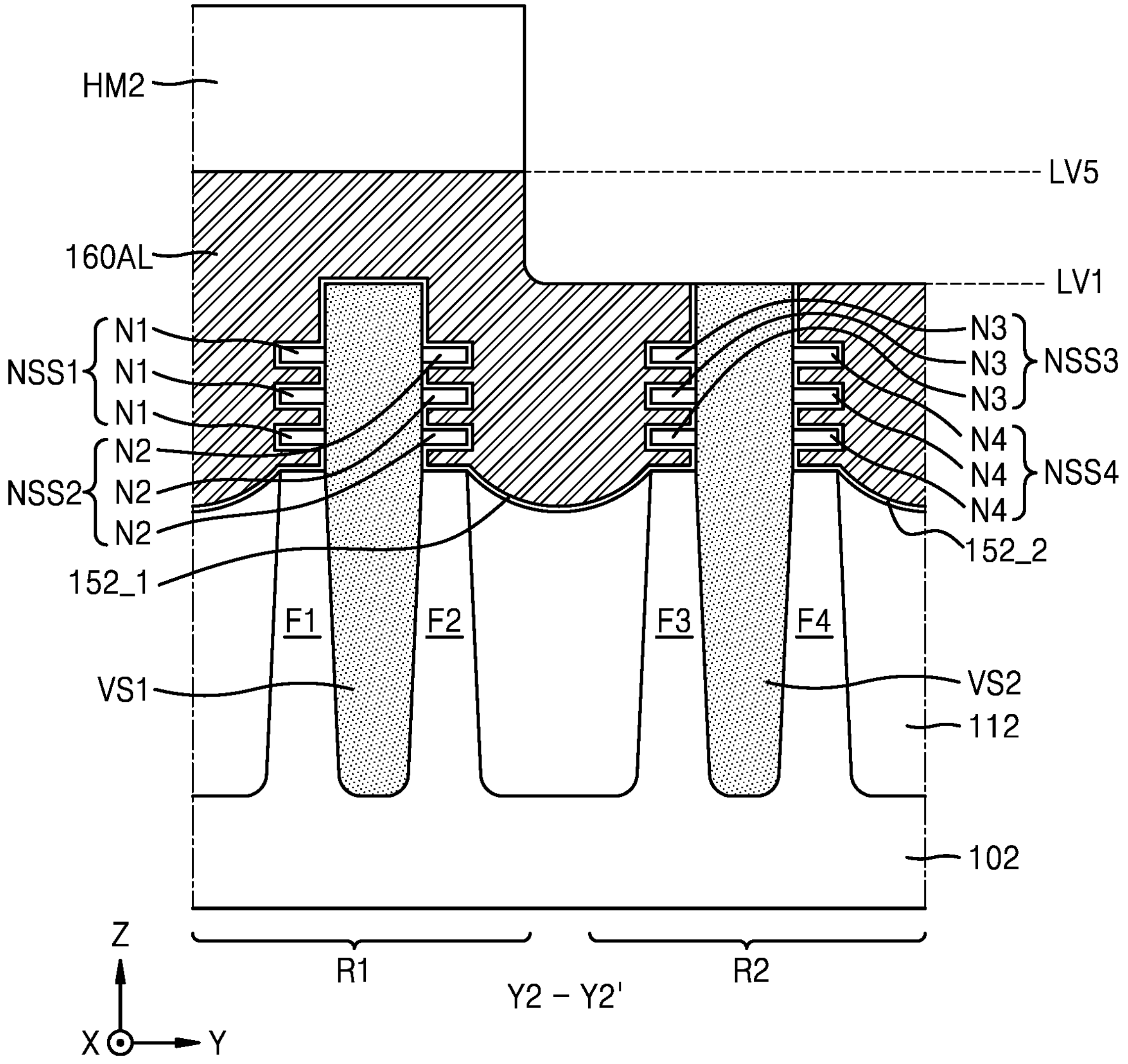
FIGS. 14, 15 and 16 are cross-sectional views of a process sequence to explain a manufacturing method of an integrated circuit device according to some embodiments.
Figure 15:
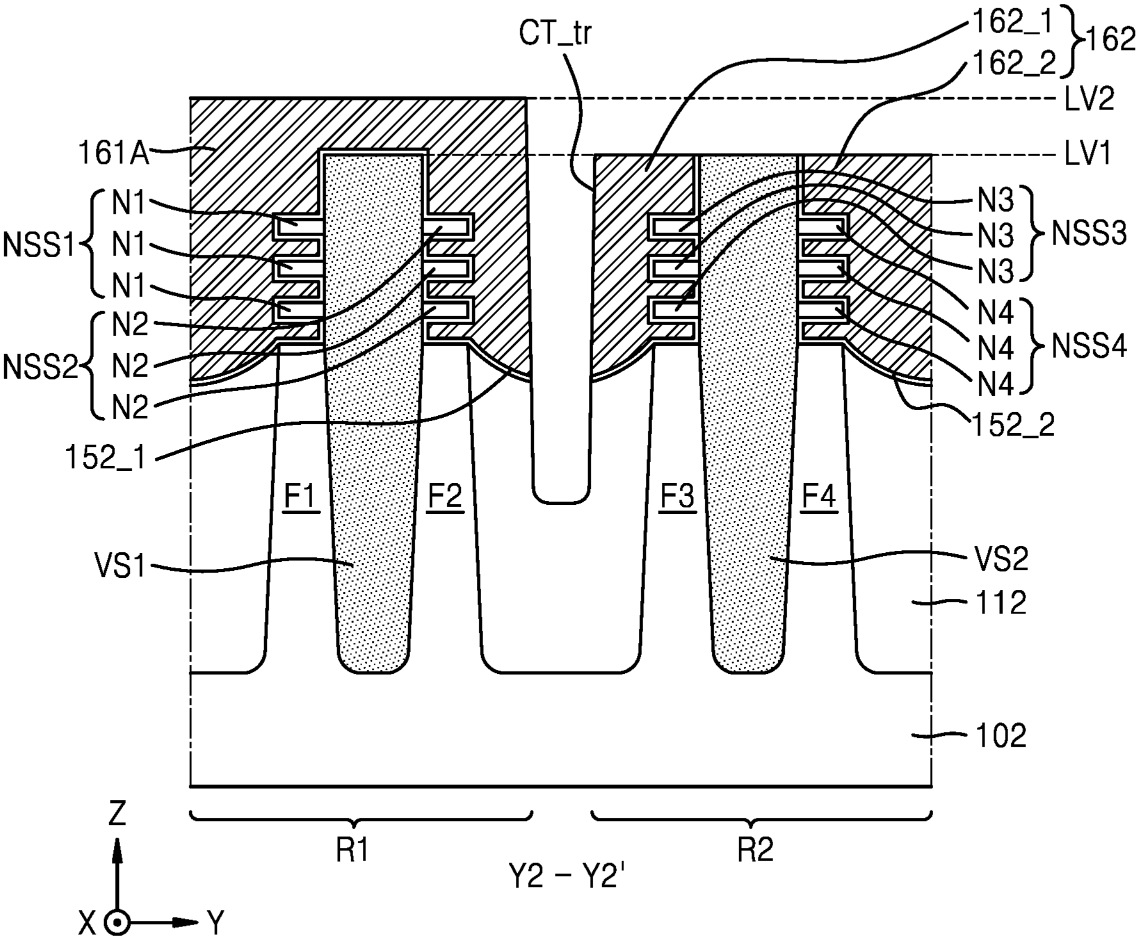
Figure 16:
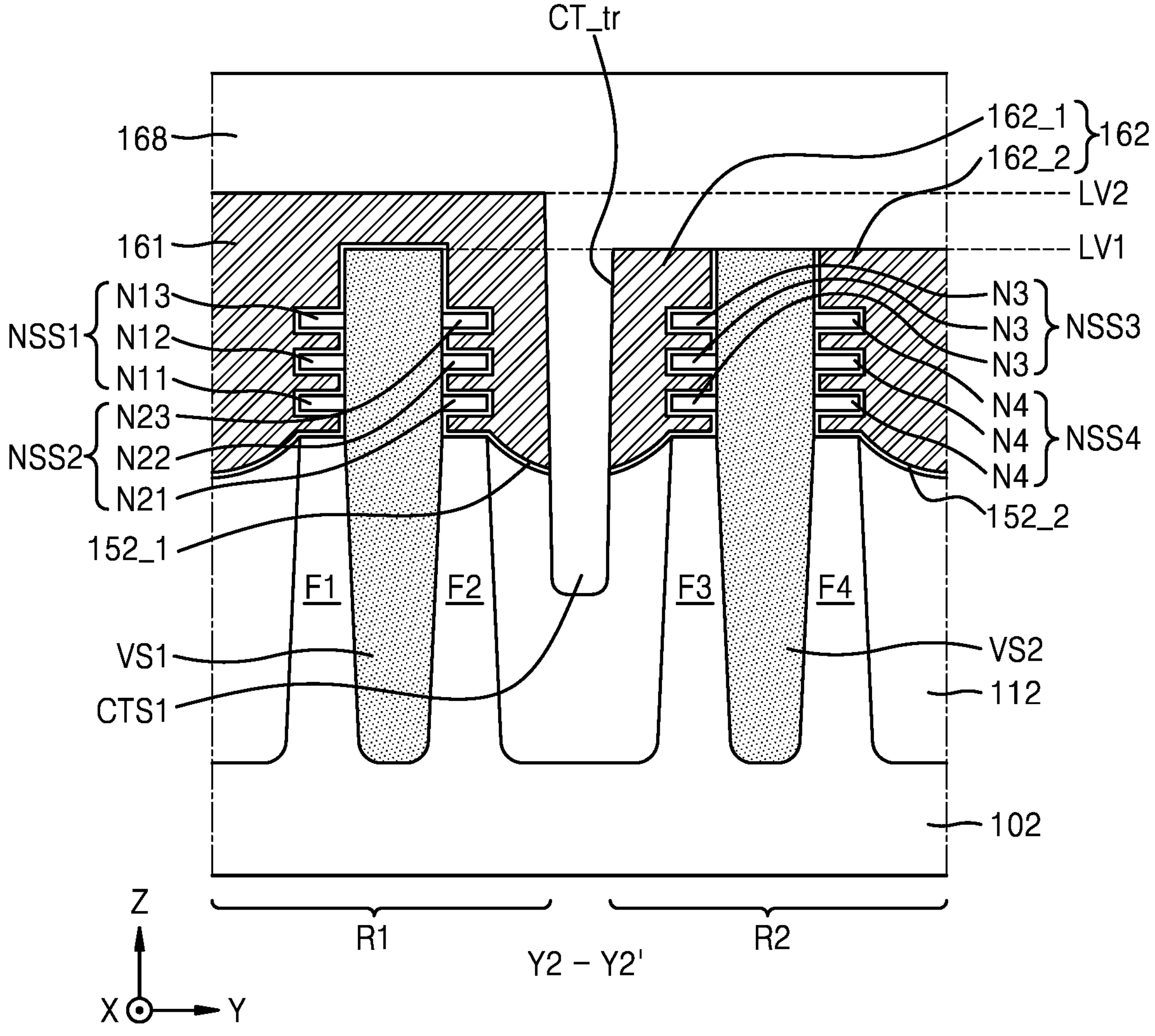

FIGS. 14, 15 and 16 are cross-sectional views shown according to a process sequence to explain a manufacturing method of an integrated circuit device 100A according to some embodiments. Specifically, FIGS. 14, 15, and 16 are cross-sectional views corresponding to FIG. 3, showing stages performed following the stages of FIGS. 10A and 10B.

Referring to FIG. 14, a second hardmask film HM2 may be formed on the first region R1 of the substrate 102, and a gate-forming conductive layer 160AL and a gate dielectric film 152 may be etched using the second hardmask film HM2 as a mask. Through the above process, the gate-forming conductive layer 160AL and the gate dielectric film 152 on the top surface of the second vertical structure VS2 may be etched to expose the top surface of the second vertical structure VS2. Through the above process, the top surface of the gate-forming conductive layer 160AL on the second region R2 may be positioned at the first vertical level LV1.

Referring to FIG. 15, the uppermost portion of the top surface of the gate-forming conductive layer 160AL may be located at the second vertical level LV2 after removing the second hardmask film HM2 and etching the gate-forming conductive layer 160L under the second hardmask film HM2. Subsequently, a cutting trench CT_tr may be formed by etching the gate-forming conductive layer 160AL and the device isolation film 112 between the second fin F2 and the third fin F3.

Through the above process, the connected gate line 161A may be formed on the first region R1 and the separated gate line 162 may be formed on the second region R2. The top surface of the connected gate line 161A may be located at the second vertical level LV2, and the top surface of the separated gate line 162 may be located at the first vertical level LV1.

Referring to FIG. 16, the first cutting structure CTS1 may be formed in the cutting trench CT_tr, and the capping insulating pattern 168 may be formed on the top surface of the connected gate line 161, the top surface of the separated gate line 162, and the top surface of the second vertical structure VS2.

Subsequently, a follow-up process may be performed to manufacture the integrated circuit device 100A described with reference to FIG. 3.

While the present disclosure has been particularly shown and described with reference to embodiments thereof, it will be understood that various changes in form and details may be made therein without departing from the spirit and scope of the following claims.

What is claimed is:

1. An integrated circuit device comprising:
- a substrate comprising a first region and a second region;
- a first fin and a second fin that extend in a first horizontal direction, are on the first region, and are adjacent to each other in a second horizontal direction that intersects the first horizontal direction;
- a third fin and a fourth fin that extend in the first horizontal direction, are on the second region, and are adjacent to each other in the second horizontal direction;
- a first channel region on the first fin;
- a second channel region on the second fin;
- a third channel region on the third fin;
- a fourth channel region on the fourth fin;
- a connected gate line that at least partially surrounds the first channel region and the second channel region, extends in the second horizontal direction, and is on the first region;
- a separated gate line comprising a first separated portion that at least partially surrounds the third channel region and a second separated portion that at least partially surrounds the fourth channel region, wherein the third channel region and the fourth channel region extend in the second horizontal direction and are on the second region;
- a first vertical structure between the first channel region and the second channel region;
- a second vertical structure that is between the third channel region and the fourth channel region and insulates the first separated portion and the second separated portion of the separated gate line from each other; and
- a plurality of source/drain regions that contact each of the first channel region, the second channel region, the third channel region, and the fourth channel region,
- wherein a top surface of the first vertical structure and a top surface of the second vertical structure are at a first vertical level,
- wherein an uppermost portion of a top surface of the connected gate line is at a second vertical level that is higher than the first vertical level, and
- wherein an uppermost portion of a top surface of the separated gate line is at the first vertical level.

2. The integrated circuit device of claim 1, wherein a lowermost portion of the top surface of the connected gate line is at the first vertical level.

3. The integrated circuit device of claim 1, wherein the connected gate line comprises:
- a first connected portion that at least partially surrounds the first channel region and is on the first fin,
- a second connected portion that at least partially surrounds the second channel region and is on the second fin, and
- a common portion that is electrically connected to the first connected portion to the second connected portion and that comprises the uppermost portion of the top surface of the connected gate line.

4. The integrated circuit device of claim 1, further comprising:
- a first gate contact electrically connected to the connected gate line; and
- a second gate contact electrically connected to the separated gate line.

5. The integrated circuit device of claim 1, wherein:
- the first region is adjacent to the second region in the second horizontal direction,
- the connected gate line overlaps the separated gate line in the second horizontal direction, and
- the integrated circuit device further comprises a cutting structure that is between the connected gate line and the separated gate line and insulates the connected gate line and the separated gate line from each other.

6. The integrated circuit device of claim 1, wherein the uppermost portion of the top surface of the connected gate line overlaps the first vertical structure in a vertical direction.

7. An integrated circuit device comprising:
- a substrate comprising a first region;
- a first fin and a second fin that extend in a first horizontal direction, are on the first region, and are adjacent to each other in a second horizontal direction that intersects the first horizontal direction;
- a first nanosheet stack that comprises a plurality of first nanosheets and is on the first fin;
- a second nanosheet stack that comprises a plurality of second nanosheets and is on the second fin;

a connected gate line that at least partially surrounds the plurality of first nanosheets and the plurality of second nanosheets and extends in the second horizontal direction on the first region;

a first vertical structure that contacts and is between the first nanosheet stack and the second nanosheet stack; and a plurality of source/drain regions spaced apart from each other, wherein the connected gate line is between the plurality of source/drain regions, wherein a top surface of the first vertical structure is at a first vertical level, wherein an uppermost portion of a top surface of the connected gate line is at a second vertical level that is higher than the first vertical level, wherein a lowermost portion of the top surface of the connected gate line is at the first vertical level, and wherein the uppermost portion of the top surface of the connected gate line overlaps the first vertical structure in a vertical direction.

8. The integrated circuit device of claim 7, wherein:

the connected gate line comprises a first connected portion that at least partially surrounds the plurality of first nanosheets and is on the first fin, a second connected portion that at least partially surrounds the plurality of second nanosheets and is on the second fin, and a common portion that electrically connects the first connected portion to the second connected portion and that comprises the uppermost portion of the top surface of the connected gate line, and a top surface of at least one of the first connected portion and the second connected portion comprises a respective portion at the first vertical level.

9. The integrated circuit device of claim 7, further comprising a first gate dielectric film that is between the plurality of first nanosheets and the connected gate line, between the plurality of second nanosheets and the connected gate line, and between the first vertical structure and the connected gate line, wherein the first gate dielectric film is on the top surface of the first vertical structure.

10. The integrated circuit device of claim 7, further comprising:

a third fin and a fourth fin that extend in the first horizontal direction, are on a second region of the substrate, and are adjacent to each other in the second horizontal direction, wherein the first region is adjacent to the second region in the second horizontal direction;

a third nanosheet stack that comprises a plurality of third nanosheets and is on the third fin;

a fourth nanosheet stack that comprises a plurality of fourth nanosheets and is on the fourth fin;

a separated gate line that comprises a first separated portion that at least partially surrounds the plurality of third nanosheets and a second separated portion that at least partially surrounds the plurality of fourth nanosheets, wherein the separated gate line extends in the second horizontal direction and is on the second region;

a second vertical structure that contacts the plurality of third nanosheets and the plurality of fourth nanosheets, is between the third nanosheet stack and the fourth nanosheet stack, and insulates the first separated portion and the second separated portion from each other; and a cutting structure that is between the connected gate line and the separated gate line and insulates the connected gate line and the separated gate line from each other, wherein a top surface of the second vertical structure is at the first vertical level, and wherein an uppermost portion of a top surface of the separated gate line is at the first vertical level.

11. The integrated circuit device of claim 10, wherein:

the first fin and the second fin have a first conductivity type, and the third fin and the fourth fin have a second conductivity type that is different from the first conductivity type.

12. The integrated circuit device of claim 10, further comprising:

a first gate contact electrically connected to the connected gate line; and a second gate contact electrically connected to the separated gate line.

13. The integrated circuit device of claim 10, wherein:

the connected gate line overlaps the separated gate line in the second horizontal direction, and the cutting structure overlaps the connected gate line and the separated gate line in the second horizontal direction.

14. The integrated circuit device of claim 10, further comprising a second gate dielectric film that is between the plurality of third nanosheets and the first separated portion and between the plurality of fourth nanosheets and the second separated portion, wherein the second gate dielectric film is not on the top surface of the second vertical structure.

15. The integrated circuit device of claim 7, further comprising:

a third fin and a fourth fin that extend in the first horizontal direction, are on a second region of the substrate, and are adjacent to each other in the second horizontal direction, wherein the second region does not overlap the first region of the substrate in the second horizontal direction;

a third nanosheet stack that comprises a plurality of third nanosheets and is on the third fin;

a fourth nanosheet stack that comprises a plurality of fourth nanosheets and is on the fourth fin;

a separated gate line that comprises a first separated portion that at least partially surrounds the plurality of third nanosheets and a second separated portion that at least partially surrounds the plurality of fourth nanosheets, wherein the separated gate line extends in the second horizontal direction and is on the second region; and a second vertical structure that contacts the plurality of third nanosheets and the plurality of fourth nanosheets, is between the third nanosheet stack and the fourth nanosheet stack, and insulates the first separated portion and the second separated portion from each other, wherein a top surface of the second vertical structure is at the first vertical level, and an uppermost portion of a top surface of the separated gate line is at the first vertical level.

16. The integrated circuit device of claim 7, wherein:

the first fin and the second fin extend onto a second region of the substrate that adjacent to the first region in the first horizontal direction, the integrated circuit device further comprises a separated gate line that comprises a first separated portion on the first fin and the second region, a second separated portion on the second fin and the second region, and a second vertical structure that is between the first separated portion and the second separated portion and insulates the first separated portion and the second separated portion from each other, the first separated portion and the second separated portion extend in the second horizontal direction, the separated gate line overlaps the connected gate line in the first horizontal direction, a top surface of the second vertical structure is at the first vertical level, and an uppermost portion of a top surface of the separated gate line is at the first vertical level.

17. The integrated circuit device of claim 7, wherein the first vertical structure comprises a portion that is between the first fin and the second fin.

18. An integrated circuit device comprising:

a substrate comprising a first region and a second region that are adjacent to each other in a second horizontal direction that intersects a first horizontal direction;

a first fin and a second fin that extend in the first horizontal direction, are on the first region, and are adjacent to each other in the second horizontal direction;

a third fin and a fourth fin that extend in the first horizontal direction, are on the second region, and are adjacent to each other in the second horizontal direction;

a first nanosheet stack that comprises a plurality of first nanosheets and is on the first fin;

a second nanosheet stack that comprises a plurality of second nanosheets and is on the second fin;

a third nanosheet stack that comprises a plurality of third nanosheets and is on the third fin;

a fourth nanosheet stack that comprises a plurality of fourth nanosheets and is on the fourth fin;

a connected gate line that at least partially surrounds the plurality of first nanosheets and the plurality of second nanosheets, extends in the second horizontal direction, and is on the first region;

a separated gate line that comprises a first separated portion that at least partially surrounds the plurality of third nanosheets and a second separated portion that at least partially surrounds the plurality of fourth nanosheets, wherein the separated gate line overlaps the connected gate line in the second horizontal direction, and wherein the separated gate line extends in the second horizontal direction and is on the second region;

a first vertical structure that contacts the plurality of first nanosheets and the plurality of second nanosheets and is between the first fin and the second fin;

a second vertical structure that contacts the plurality of third nanosheets and the plurality of fourth nanosheets, is between the third fin and the fourth fin, and insulates the first separated portion and the second separated portion from each other;

a cutting structure that is between the connected gate line and the separated gate line and insulates the connected gate line and the separated gate line from each other;

a first gate contact electrically connected to the connected gate line; and a second gate contact electrically connected to the separated gate line, wherein a top surface of each of the first vertical structure and a top surface of the second vertical structure are at a first vertical level, wherein an uppermost portion of a top surface of the connected gate line is at a second vertical level that is higher than the first vertical level, wherein an uppermost portion of a top surface of the separated gate line is at the first vertical level, and wherein the uppermost portion of the top surface of the connected gate line overlaps the first vertical structure in a vertical direction.

19. The integrated circuit device of claim 18, wherein a lowermost portion of the top surface of the connected gate line is at the first vertical level.

20. The integrated circuit device of claim 18, wherein:

the connected gate line comprises a first connected portion that at least partially surrounds the plurality of first nanosheets and is on the first fin, the connected gate line comprises a second connected portion that at least partially surrounds the plurality of second nanosheets and is on the second fin, the connected gate line comprises a common portion that electrically connects the first connected portion to the second connected portion and that comprises the uppermost portion of the top surface of the connected gate line, and a top surface of at least one of the first connected portion and the second connected portion comprises a respective portion at the first vertical level.

* * * * *